(12) United States Patent
Kikuchi et al.

(10) Patent No.: US 7,372,130 B2
(45) Date of Patent: May 13, 2008

(54) SEMICONDUCTOR DEVICE INCLUDING A SEMICONDUCTOR CHIP FORMED ON AN INSULATING ELEMENT SUCH AS A TAPE, AND INCLUDING AN IMPROVED INSULATING ARRANGEMENT

(75) Inventors: Koya Kikuchi, Kawabe (JP); Noriou Shimada, Yuwa (JP); Keiyo Kusanagi, Akita (JP); Akihiko Hatasawa, Akita (JP); Yutaka Kagaya, Hachimori (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/921,961

(22) Filed: Aug. 20, 2004

(65) Prior Publication Data

US 2005/0258519 A1 Nov. 24, 2005

(30) Foreign Application Priority Data

May 20, 2004 (JP) ............................. 2004-149833

(51) Int. Cl.
*H01L 23/495* (2006.01)
(52) U.S. Cl. ..................... 257/668; 257/671; 257/676; 257/E23.055; 257/E23.06; 257/E23.065; 257/E23.066
(58) Field of Classification Search ............... 257/668, 257/671, 676, 678, E23.055, E23.06, E23.065, 257/E23.066
See application file for complete search history.

(56) References Cited

U.S. PATENT DOCUMENTS 5,357,400 A * 10/1994 Takekawa ................... 361/704

| | | | |
|---|---|---|---|
| 5,585,666 A * | 12/1996 | Imamura | 257/668 |
| 6,078,506 A * | 6/2000 | Sugahara | 361/783 |
| 6,088,901 A * | 7/2000 | Huber et al. | 29/469.5 |
| 6,380,620 B1 * | 4/2002 | Suminoe et al. | 257/706 |
| 6,388,333 B1 * | 5/2002 | Taniguchi et al. | 257/777 |
| 6,388,888 B1 * | 5/2002 | Seko et al. | 361/767 |
| 6,395,578 B1 | 5/2002 | Shin et al. | |
| 6,713,850 B1 * | 3/2004 | Yuan et al. | 257/668 |
| 2001/0008779 A1 * | 7/2001 | Miyaki et al. | 438/111 |

FOREIGN PATENT DOCUMENTS

| JP | 02097044 A * | 4/1990 |
|---|---|---|
| JP | 10-163250 | 6/1998 |
| JP | A-2000-340713 | 8/2000 |
| JP | 2001-093943 | 4/2001 |
| JP | A-2001-223297 | 8/2001 |
| JP | 2001-332580 | 11/2001 |

* cited by examiner

*Primary Examiner*—Matthew E. Warren
(74) *Attorney, Agent, or Firm*—Antonelli, Terry, Stout & Kraus, LLP.

(57) ABSTRACT

A semiconductor device includes: an insulating tape having a device hole and a plurality of holes; a plurality of leads formed on one surface of the tape and extending at one end into the device hole and at the other end into the holes; a semiconductor chip having a plurality of electrodes on a main surface thereof, being connected with the leads extending into the device hole; an encapsulant formed of an insulating resin, the leads and a predetermined portion of the tape; bump electrodes provided on one surface of the leads; slits provided in the tape between the encapsulant and the bump electrodes and extending along a column of the bump electrodes; and a warp prevention reinforcement made of an insulating film and formed over the tape; wherein the semiconductor chip and the bump electrodes are connected to one and the same surface side of the leads.

21 Claims, 18 Drawing Sheets

BUMP FABRICATION

INNER LEAD BONDING

ENCAPSULATIONING

BOLL MOUNT/WASHING

PIECE CUT/TEST

FORMING-CUTTING

SEMICONDUCTOR DEVICE INCLUDING A SEMICONDUCTOR CHIP FORMED ON AN INSULATING ELEMENT SUCH AS A TAPE, AND INCLUDING AN IMPROVED INSULATING ARRANGEMENT

INCORPORATION BY REFERENCE

The present application claims priority from Japanese application JP2004-149833 filed on May 20, 2004, the content of which is hereby incorporated by reference into this application.

BACKGROUND OF THE INVENTION

The present invention relates to a semiconductor device of BGA (Ball Grid Array) structure and a method for fabricating the same and more particularly to a technology advantageously applied to a T-BGA manufacturing using a TAB (Tape Automated Bonding) tape having leads formed on a surface of an insulating film.

As functions of electronic devices become more sophisticated, the number of components incorporated in them tends to increase. There are also increasing demands on the electronic devices for a smaller size and a lighter weight. Portable electronic devices such as mobile information terminals in particular are being pressed for further reductions in size, thickness and weight. To meet this requirement, efforts are being made to make the electronic components including semiconductor devices mounted on electronic devices still smaller in size, thickness and weight.

As package structures that will make for an improved integration of semiconductor devices and for size and weight reductions, there have been known a TGA that uses a TAB (Tape Automated Bonding) tape having leads formed on a surface of an insulating film (T-BGA) and a FBGA (Fine Pitch BGA) using the TAB tape. These package products that use as a printed circuit board a TAB tape having wires formed on a surface of an insulating film such as polyimide resin film (TCP: Tape Carrier Packages) allow for a higher density, more sophisticated functions and an increased number of pins and also have features of excellent electric characteristics.

On the other hand, semiconductor devices suited to three-dimensional mounting, which improves a mounting density by stacking a plurality of semiconductor devices one upon the other, have been proposed (for example in patent reference 1).

A semiconductor device described in JP-A-2001-223297 has a structure in which a semiconductor chip is mounted on one side of an interposer, with electrodes of the semiconductor chip connected to bonding pads through wires. Ball pads connected to the bonding pads are provided with solder balls. Further, the interposer is formed with through-holes on the side opposite the solder balls of the ball pads. The height of the solder balls is greater than the height of an encapsulant resin enclosing the semiconductor chip. As a result, when the semiconductor devices are stacked together, lower ends of the solder balls of the upper layer semiconductor device overlap the ball pads exposed in the through-holes of the lower layer semiconductor device to make electrical connections.

On the other hand, as a semiconductor package for improving a heat dissipation performance as well as reducing the thickness, a structure has been proposed in which a semiconductor chip is situated at a through-hole formed in the printed circuit board, with a first surface of the chip or a second surface opposite the first surface exposed to dissipate heat from the exposed surface (e.g., JP-A-2000-340713).

The applicant of this invention is also developing a semiconductor device suited to a three-dimensional mounting which uses a TAB tape. This semiconductor device has a structure in which the leads protruding into a device hole provided in the TAB tape are connected to electrodes on a semiconductor chip, in which the portions of the leads situated in the holes are connected with bump electrodes to allow for three-dimensional mounting, and in which one surface side of the semiconductor chip is covered with an insulating resin to cover the leads.

In this structure, however, it is found that, during the process of manufacturing a semiconductor device, a tape substrate formed of a TAB tape which serves as a rearrangement printed wiring board may be warped by thermal stresses.

An object of this invention is to provide a thin semiconductor device free from warping and a method of manufacturing the same.

Another object of this invention is to provide a thin semiconductor device free from warping which is suited to three-dimensional mounting and a method of manufacturing the same.

Still another object of this invention is to provide a thin semiconductor device free from warping at low cost.

The above and other objects and novel features of this invention will become apparent from the following description and the accompanying drawings.

SUMMARY OF THE INVENTION

Representative aspects of this invention disclosed in this application will be briefly explained as follows.

(1) A semiconductor device comprises:

an insulating tape (film) having a first surface, a second surface opposite the first surface, a device hole and a plurality of holes;

a plurality of leads formed on the first or second surface of the tape and extending into the device hole and into the holes;

a semiconductor chip having a plurality of electrodes on a main surface thereof, the electrodes being connected with the leads extending into the device hole;

an encapsulant formed of an insulating resin on the main surface side of the semiconductor chip to enclose the semiconductor chip, the leads and a predetermined portion of the tape;

bump electrodes provided on one surface of the leads extending into the holes;

slits provided in the tape between the encapsulant and the bump electrodes and extending along a column of the bump electrodes; and a warp prevention reinforcement made of an insulating film and formed over the tape to hold the leads between it and the tape;

wherein the semiconductor chip and the bump electrodes are connected to one and the same surface side of the leads and the bump electrodes are formed thicker than the semiconductor chip.

Further, the semiconductor chip is rectangular and the encapsulant enclosing this semiconductor chip is also rectangular-shaped. At portions of the tape corresponding to corners of the encapsulant, there are provided slits (corner slits) that bend along the corners of the encapsulant. The tape is formed of a polyimide resin film, the encapsulant is formed of an epoxy resin, and the warp prevention reinforcement is formed of a solder resist film. The warp prevention reinforcement is provided on a portion of the tape outside the encapsulant. The semiconductor chip may be a center pad chip in which electrodes are arranged along a center of the main surface or a side pad chip in which electrodes are arranged along edges of the main surface.

Such a semiconductor device is manufactured by a method which comprises the steps of:

(a) preparing a TAB tape, the TAB tape having an insulating tape having a first surface, a second surface opposite the first surface, a device hole and a plurality of holes, a plurality of leads formed on the first or second surface of the tape and extending into the device hole and into the holes, slits arranged along columns of the holes and provided in a portion of the tape inside the hole columns, and a warp prevention reinforcement made of an insulating film and formed over the tape to hold the leads between it and the tape;

(b) putting front ends of the leads, which extend into the device hole, on the electrodes of the semiconductor chip, which has a plurality of electrodes on a main surface thereof, and electrically connecting them together;

(c) forming an encapsulant from an insulating resin on a main surface side of the semiconductor chip to enclose the semiconductor chip, the leads and a predetermined portion of the tape;

(d) forming bump electrodes on that surface side of the leads running through the holes to which the semiconductor chip is connected, the bump electrodes being formed thicker than the semiconductor chip;

(e) performing an electric characteristic test by using the bump electrodes as measuring terminals; and (f) cutting the TAB tape to a predetermined shape.

The semiconductor chip is rectangular and the encapsulant enclosing the semiconductor chip is also rectrangularly shaped. At tape portions corresponding to the corners of the encapsulant the TAB tape is provided with slits (corner slits) that bend along the corners of the encapsulant. The warp prevention reinforcement formed of a solder resist film is provided on a tape area outside the slits. The semiconductor chip may be a center pad chip in which electrodes are arranged along a center of the main surface or a side pad chip in which electrodes are arranged along edges of the main surface.

(2) A multi-tier type semiconductor device having a plurality of semiconductor devices of the above means (1) stacked one upon the other, wherein the bump electrodes of the semiconductor device on an upper tier are electrically connected to the leads running through the holes in the semiconductor device on a lower tier.

Such a semiconductor device is manufactured by stacking one upon the other a plurality of the semiconductor devices fabricated by the semiconductor device manufacturing method of the above means (1) and by electrically connecting the bump electrodes of the semiconductor device on an upper tier to the leads running through the holes in the semiconductor device on a lower tier.

Effects produced by the representative aspects of the invention disclosed in this application may be briefly explained as follows.

The above means (1) offers the following advantages.

(a) Since the slits are provided between the encapsulant and the bump electrode columns, if the tape is subjected to thermal stresses caused by material differences, the stresses are absorbed and eliminated by the slits, preventing the tape, or the semiconductor device, from being distorted. As a result, when the semiconductor device is mounted on a mounting board through bump electrodes, the semiconductor device is free from deformations such as warping and twisting, ensuring an accurate, reliable mounting. It is noted that bent slits are provided at portions corresponding to the corners of the encapsulant. Because the length of a diagonal line between the opposing corners represents the longest length of the tape and the slits are provided at these corners, warping and twisting of the tape or semiconductor device hardly occur.

(b) Outside the slits, i.e., in a tape portion outside the encapsulation, the warp prevention reinforcement formed of a solder resist film is provided. This arrangement makes it unlikely for the semiconductor device to be warped or twisted, assuring an accurate, reliable mounting of the semiconductor device.

(c) As described in the above (a) and (b), the semiconductor device is formed with slits between the encapsulant and the bump electrode columns and the tape portion outside the slits (encapsulant) is provided with the warp prevention reinforcement made of a solder resist film. This arrangement prevents the semiconductor device from being warped or twisted, allowing it to be mounted precisely and reliably.

(d) On one and the same surface side of the leads, which are supported on one surface of the tape, the semiconductor chip and the bump electrodes are provided. The encapsulant is formed on that surface side of the leads to which the semiconductor chip is connected. This arrangement makes for a reduced thickness of the semiconductor device. For example, the height of the semiconductor device can be made less than 0.5 mm.

(e) During the process of forming the encapsulant, if a resin of the encapsulant should flow, the flow stops at the inner or outer edge of the slits by the surface tension of the resin. This results in a well-shaped encapsulation with good appearance.

The multi-tier type semiconductor device according to the above means (2) is a semiconductor device formed by stacking together in multiple tiers the semiconductor devices which are made free from warping or twisting by the means (1). This construction offers the following advantages.

(a) The vertically adjoining semiconductor devices can be electrically connected reliably through the bump electrodes and the leads. A precise, reliable mounting is also assured.

(b) Since the multi-tier type semiconductor device is made up of thin semiconductor devices, the overall thickness of the multi-tier type semiconductor device can be made thin.

(c) In combined semiconductor devices, some of them may be fabricated using a center pad chip in which electrodes are arrayed along a center of the main surface and the remaining semiconductor devices may be fabricated using a side pad chip in which electrodes are arrayed along edges of the main surface. With this arrangement it is possible to manufacture a multi-tier type semiconductor device which comprises semiconductor devices incorporating the center pad chip and semiconductor devices incorporating the side pad chip.

(d) In the manufacture of individual semiconductor devices, a characteristic test is performed. This permits only those semiconductor devices that have passed the characteristic test to be used in the manufacture of the multi-tier semiconductor device, thus reducing a failure rate.

Other objects, features and advantages of the invention will become apparent from the following description of the embodiments of the invention taken in conjunction with the accompanying drawings.

DETAILED DESCRIPTION OF THE EMBODIMENTS

Figure 1:
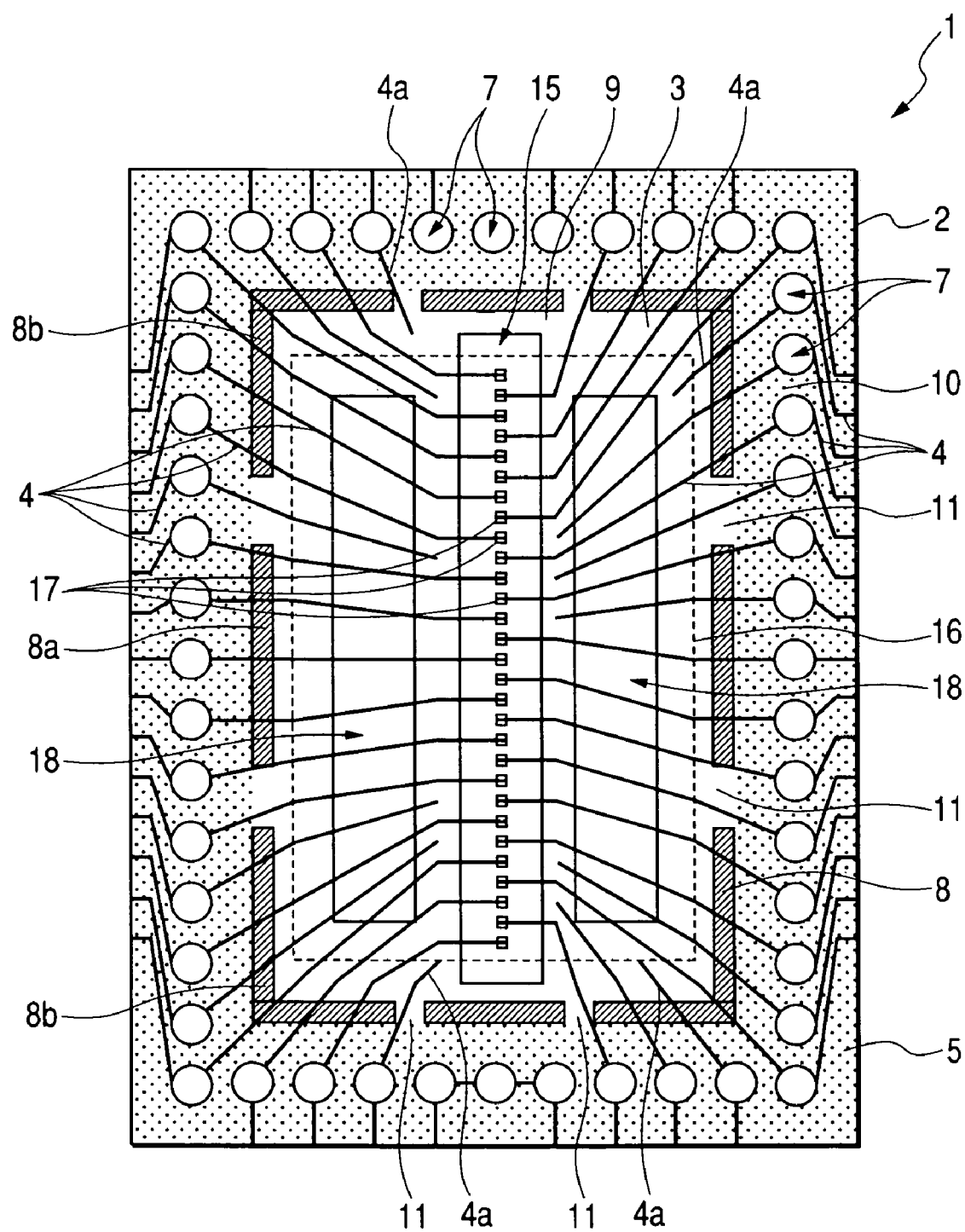
FIG. 1 is a plan view of a semiconductor device of embodiment 1 with a sealant omitted.

Now, embodiments of this invention will be described in detail by referring to the accompanying drawings. Throughout the drawings used to explain about the embodiments of this invention, components with identical functions are given like reference numbers and their repetitive explanations are omitted.

Embodiment 1

Embodiment 1 represents an example case in which this invention is applied to a semiconductor device that can be stacked in multiple tiers and to a multi-tiered semiconductor device. Further, the embodiment 1 uses a semiconductor chip of a so-called center pad structure having electrodes arrayed in a line along the center of a main surface. FIG. 1 through FIG. 18 show a semiconductor device and a manufacturing process of the same as the embodiment 1 of this invention.

The semiconductor device 1 of the embodiment 1 is, as shown in FIG. 1 to FIG. 4, a fan-out type semiconductor device in which external electrode terminals are arranged outside the semiconductor chip. FIG. 1 through FIG. 4 show the structure of the semiconductor device 1, FIG. 1 being a plan view of the semiconductor device 1 with an encapsulant 19 omitted, FIG. 2 a plan view showing the semiconductor device 1, FIG. 3 a cross section of the semiconductor device 1 taken along line X-X of FIG. 2, and FIG. 4 a bottom view of the semiconductor device of FIG. 2.

As shown in FIG. 1 to FIG. 4, the semiconductor device 1 has mounted on an underside of a rectangular tape printed circuit board 2 a semiconductor chip 16 which, with its main surface facing up, is connected through electrodes 17 to inner ends of leads 4. Along the periphery on the underside of the tape printed circuit board 2 columns of bump electrodes 6 are arranged. On the outside of and along the semiconductor chip 16 are formed non-continuous slits 8. In an area inside this rectangular frame of slits 8, an encapsulant 19 made of an insulating resin is provided. The encapsulant 19 encloses a part of the tape printed circuit board 2 which includes the main surface of the semiconductor chip 16 and the leads 4. Areas above portions of the leads 4 attached with the bump electrodes 6 are open so that bump electrodes 6 of another semiconductor device 1 can be stacked and connected to the upper surface of the leads 4. Thus, the bump electrodes 6 protrude down below the semiconductor chip 16. On the upper surface area of the board outside the slits 8, there is provided a warp prevention reinforcement 5, a protective film that doubles as a reinforcement to prevent warping and twisting of the tape printed circuit board 2. The warp prevention reinforcement 5 is indicated by an area with small dots in FIG. 1 and FIG. 2.

Figure 3:
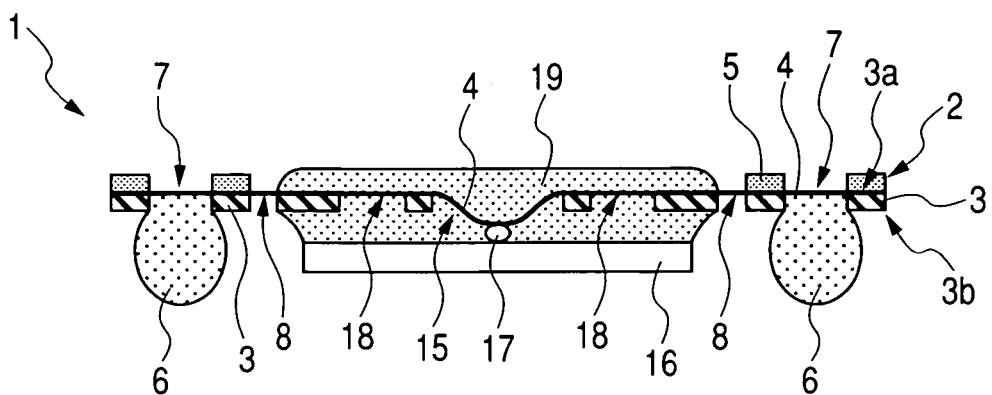
FIG. 3 is a cross-sectional view of the semiconductor device of embodiment 1 taken along the line X-X of FIG. 2.
Figure 4:
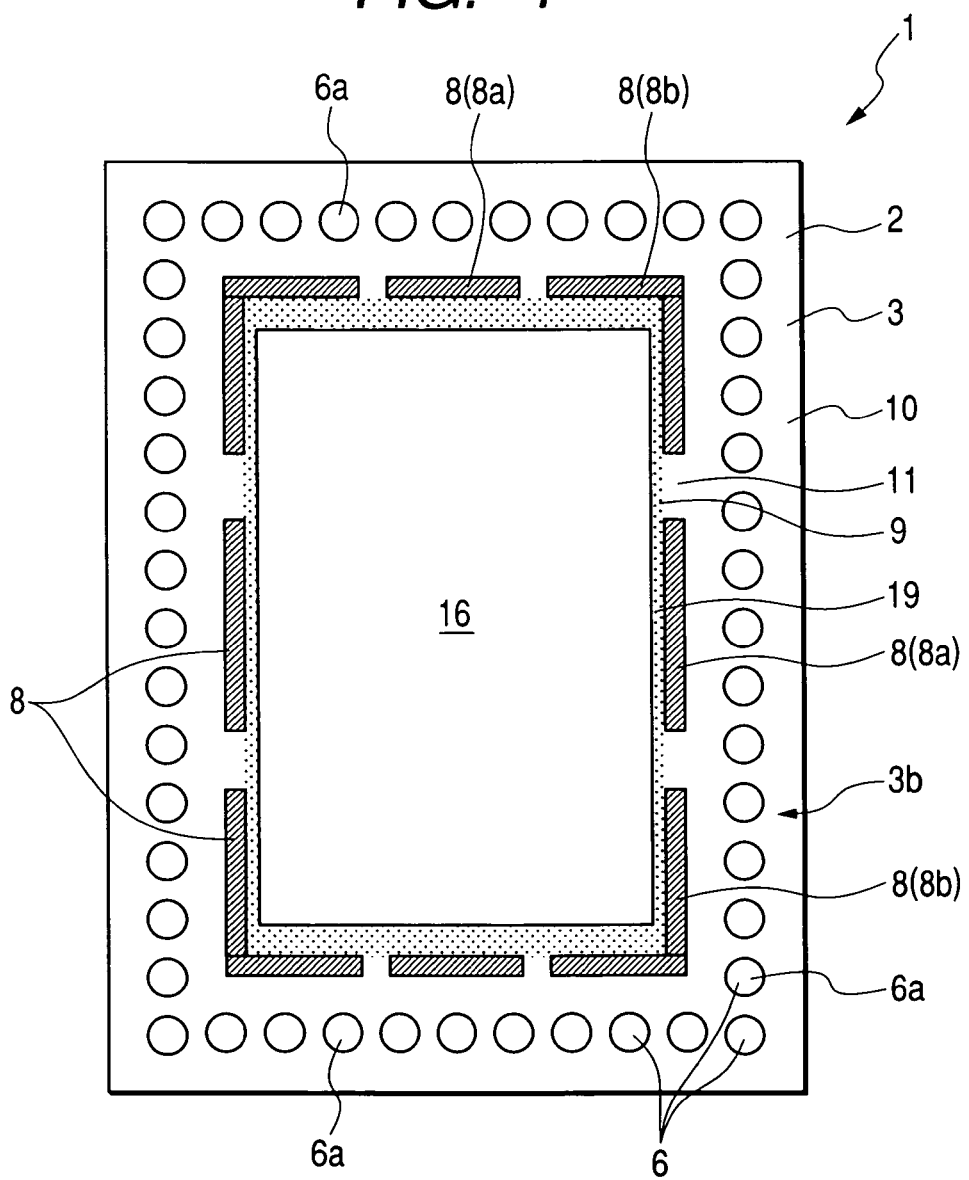
FIG. 4 is a bottom view of the semiconductor device of embodiment 1.

Next, individual components will be explained in detail. The rectangular tape printed circuit board 2 is formed by cutting a TAB tape into rectangles. The tape printed circuit board 2, as shown in FIG. 3, comprises an insulating tape 3, a plurality of leads 4 formed on one surface (first surface 3a: upper surface in FIG. 3) of the tape 3, and an insulating protective film 5 formed on the first surface 3a of the tape 3 that holds the leads 4 between it and the tape 3. The protective film 5 constitutes the warp prevention reinforcement 5.

The semiconductor device 1 of this embodiment 1, because it is of fan-out type as shown in FIG. 1 and FIG. 3, is formed with holes 7 at a predetermined pitch near and along side edges of the tape printed circuit board 2 (tape 3) to form bump electrodes that serve as external electrode terminals. The leads 4 extend across the holes 7 (areas) and those portions of the leads 4 within the holes 7 constitute pads on which bump electrodes are formed. On the underside of these pads (leads 4) are formed the bump electrodes 6 that serve as external electrode terminals. The bump electrodes 6 protrude on a second surface 3b opposite the first surface 3a. The holes 7 are formed in the tape 3, which is then formed with the leads 4, followed by the warp prevention reinforcement 5. The warp prevention reinforcement (protective film) 5 is formed on the first surface 3a of the tape 3. The leads 4 in the holes 7, i.e., the pads, are formed with a plated film on their front and back surfaces to make good connections. This is because the bump electrodes are formed on the underside of the pads and because, when semiconductor devices 1 are stacked together, the bump electrodes of an upper tier semiconductor device are connected to the upper surface of the leads 4. The leads 4 are formed by patterning a copper foil and their surfaces are plated with a gold film. As shown in FIG. 1, the tape 3 is formed with an elongate device hole 15 (i.e., an elongate opening penetrating the insulating tape 3) extending along a central longitudinal direction of the tape 3. The leads 4 also protrude into the device hole 15 in a cantilever manner. Front ends of these leads 4 are connected in a staggered manner to respective electrodes 17 of the semiconductor chip 16 of the center pad structure (see FIG. 3). In FIG. 1, a rectangle shown by a dotted line represents the semiconductor chip 16. Areas of the tape 3 on both sides of the device hole 15 that face the semiconductor chip 16 are formed with an opening 18 along the device hole 15.

Inside the rectrangularly arrayed holes 7 and outside the semiconductor chip 16 are provided discontinuous slits 8 arranged in a rectangular shape.

Figure 2:
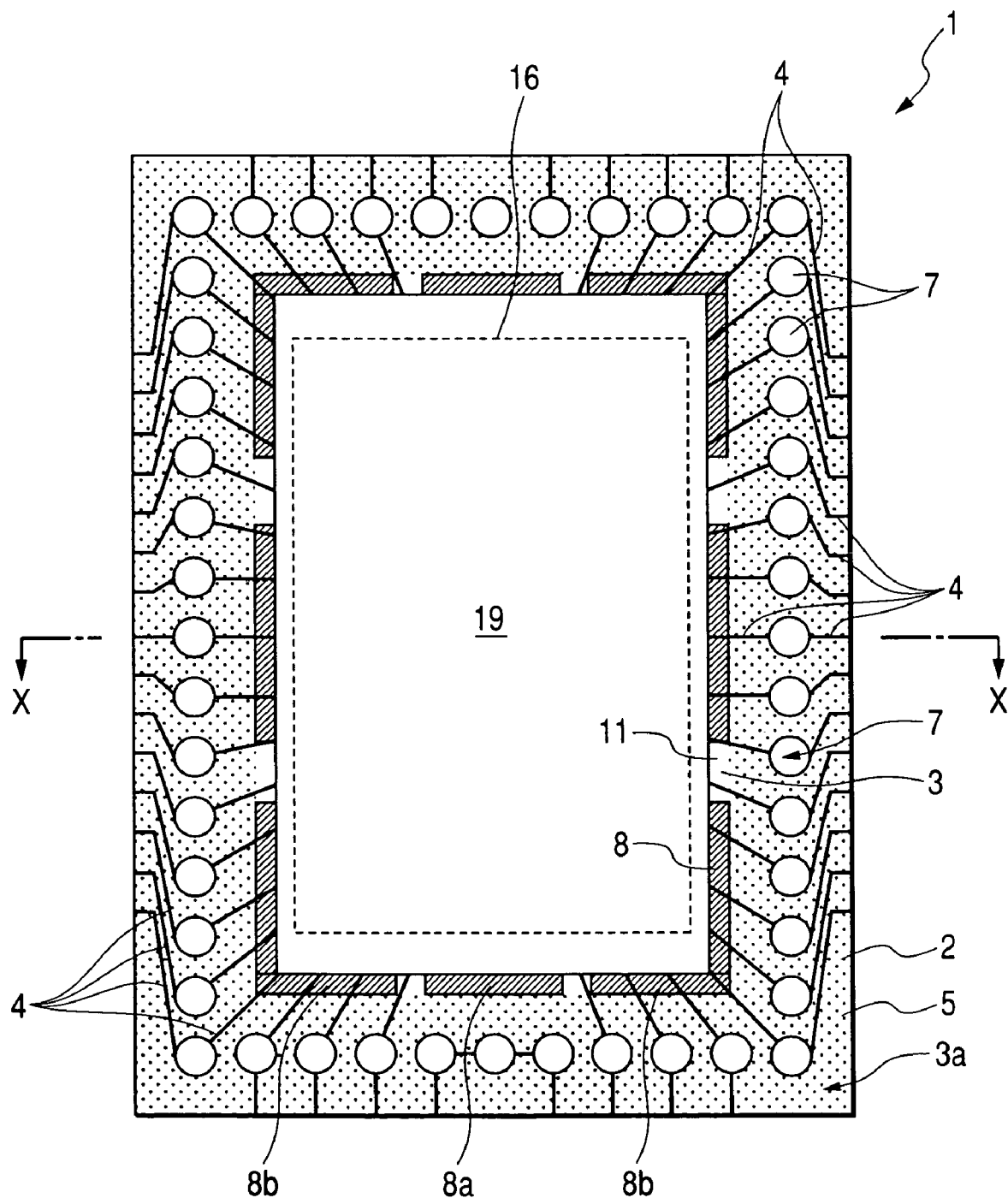
FIG. 2 is a plan view showing the semiconductor device of embodiment 1.

As shown in FIG. 2 and FIG. 3, the encapsulant 19 of insulating resin is formed on the main surface of the semiconductor chip 16 on which the electrodes 17 are provided. The encapsulant 19 encloses the tape 3 and the leads 4 on the main surface side of the semiconductor chip 16. The encapsulant 19 covers the entire area inside the slits 8 to seal the device hole 15 and the openings 18.

The slits 8, as shown in FIG. 1, comprise linear slits 8a extending linearly along the sides of the tape printed circuit board 2 and corner slits 8b that bend at right angles and extend along the corners of the rectangle. The linear slits 8a and linear portions of the corner slits 8b extend along one of the sides of the tape printed circuit board 2.

These linear slits 8a and the corner slits 8b are provided discontinuously, so a portion of the tape printed circuit board inside the rectrangularly arrayed slits 8 (inside-the-slits tape portion 9) is supported by a portion of the tape printed circuit board outside the rectrangularly arrayed slits 8 (outside-the-slits tape portion 10) through connecting portions 11 between the slits. The slits 8 are provided to disconnect stresses (including thermal stresses) between the inside area and outside area of the tape printed circuit board 2 and thereby eliminate it, the stresses being applied to the tape printed circuit board 2 itself or to members making up the semiconductor device including the tape printed circuit board 2 at each manufacturing stage of the semiconductor device 1 or after the fabrication process. This arrangement prevents the portion including the tape printed circuit board 2 from becoming warped or twisted. The slits 8 also serve to stop the resin from flowing outside (into the outside-the-slits tape portion 10) when the chip is sealed.

Therefore, the width of the connecting portions 11 is preferably set as narrow as possible, provided the inside-the-slits tape portion 9 can be supported by the outside-the-slits tape portion 10. That is, the smaller the width of the connecting portions 11, the more easily the stresses can be disconnected between the inside-the-slits tape portion 9 and the outside-the-slits tape portion 10 and the smaller the stresses will be made, effectively preventing the warping and twisting.

Further, the narrower the connecting portions 11, the narrower the width of outflow paths through which the resin flows from the inside-the-slits tape portion 9 toward the outside-the-slits tape portion 10 during the encapsulation operation. As the width of the outflow paths is reduced, the surface tension (viscosity) of resin has an increased influence on the flow and thus can more easily stop the resin outflow. Because of the surface tension of the resin, the resin stops flowing at the inner edge or outer edge of the slits 8. As a result, the encapsulant's outline shape is properly defined by the slits.

The first surface 3a of the outside-the-slits tape portion 10 of the tape 3 is formed with the warp prevention reinforcement 5 made of a solder resist film (solder mask). The holes 7 are formed in the same area where the warp prevention reinforcement 5 is provided. In the plan views of FIG. 1 and subsequent figures, the area where the warp prevention reinforcement 5 is provided is indicated by small dots for easy identification. In the embodiment 1, the warp prevention reinforcement 5 is provided only outside the rectangularly arrayed slits 8 and not inside the slits, i.e., in the inside-the-slits tape portion 9.

The inside-the-slits tape portion 9 is selectively formed with the openings 18 to disconnect and reduce warping and twisting caused by a difference in thermal expansion coefficient between the tape 3 formed of resin (polyimide resin) and the leads 4 formed of a conductor (Cu foil).

The leads 4 passing through each of the holes 7 are bent as required and have one of their ends (inner end) extend from one of the longer sides of the device hole 15 into the device hole 15 and the other end extend to reach the outer edge of the tape 3. The semiconductor device 1 is formed by cutting a TAB tape, at which time the leads are also cut. So the outer end of the leads 4 lies at the outer edge of the tape 3. Some leads 14 pass through the slits 8 and the opening 18 and some do not pass through the slits 8 nor the opening 18.

To balance stresses such as thermal stresses, this embodiment 1 provides dummy leads 4a and dummy bump electrodes 6a both not connected to the electrodes 17 of the semiconductor chip 16.

Here, let us explain about dimensions of an example structure. The tape 3 is formed of a polyimide resin film 50 μm thick. The first or second surface of the tape 3 formed with the device hole 15, openings 18, holes 7 and slits 8 is bonded with a copper foil 35 μm thick using an adhesive about 12 μm thick. Then the copper foil is etched to a desired pattern to form the leads 4. The width of the slits 8 is about 500 μm. A solder mask used to form the warp prevention reinforcement 5 has a thickness of about 20 μm. The holes 7 are each about 350 μm across. The leads 4 have their portions in the device hole 15 plated with a gold film on the bottom surface and also their portions in the holes 7 plated with a gold film on the top and bottom surfaces. The bump electrodes 6 connected to the bottom surface of the leads 4 in the holes 7 are solder balls, say, 400 μm across and, after connection, is 250 μm thick, extending approximately 50 μm down from the lower end of the semiconductor chip 16. Since the bump electrodes 6 melt and soften as they are connected to the lands of a mounting substrate during the mounting of the semiconductor device 1, a structure may also be used in which the lower end of the bump electrodes 6 are situated almost as high as the lower end of the semiconductor chip 16. The height (thickness) of the semiconductor device 1 is 0.5 mm or less.

Figure 6:
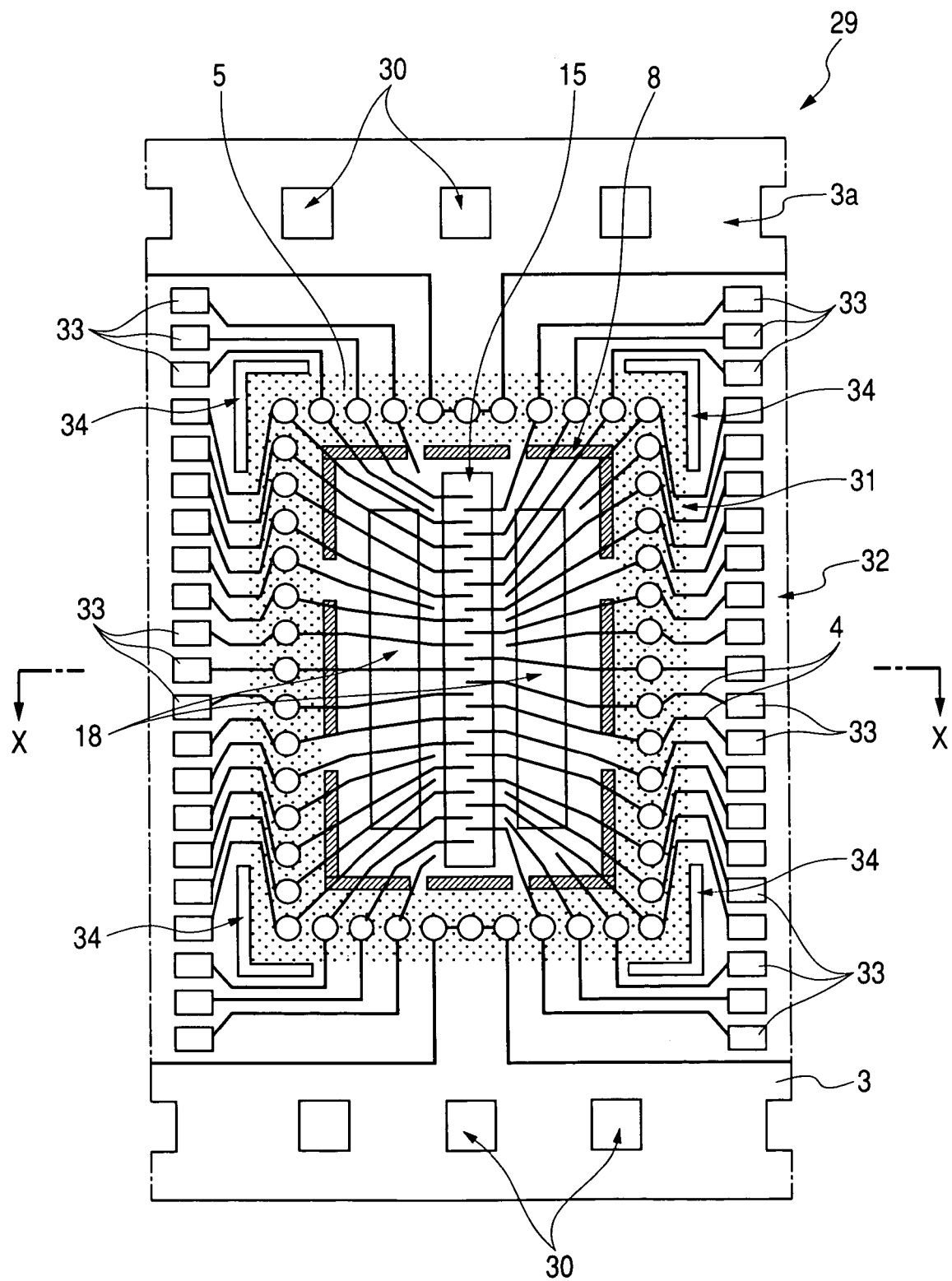
FIG. 6 is a plan view showing a part of a TAB tape used in the manufacture of the semiconductor device of embodiment 1.
Figure 7:
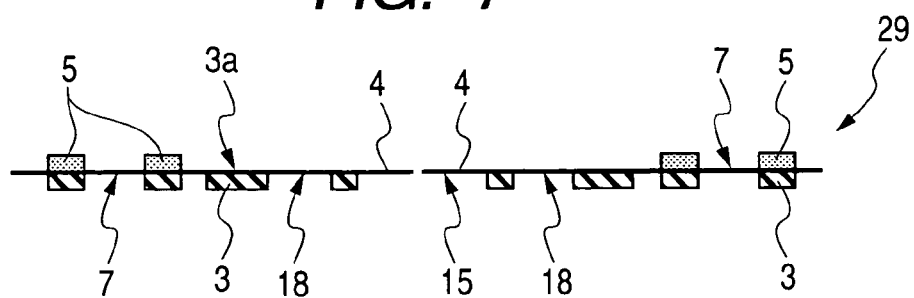
FIG. 7 is a cross-sectional view of the TAB tape taken along the line X-X of FIG. 6.
Figure 8:
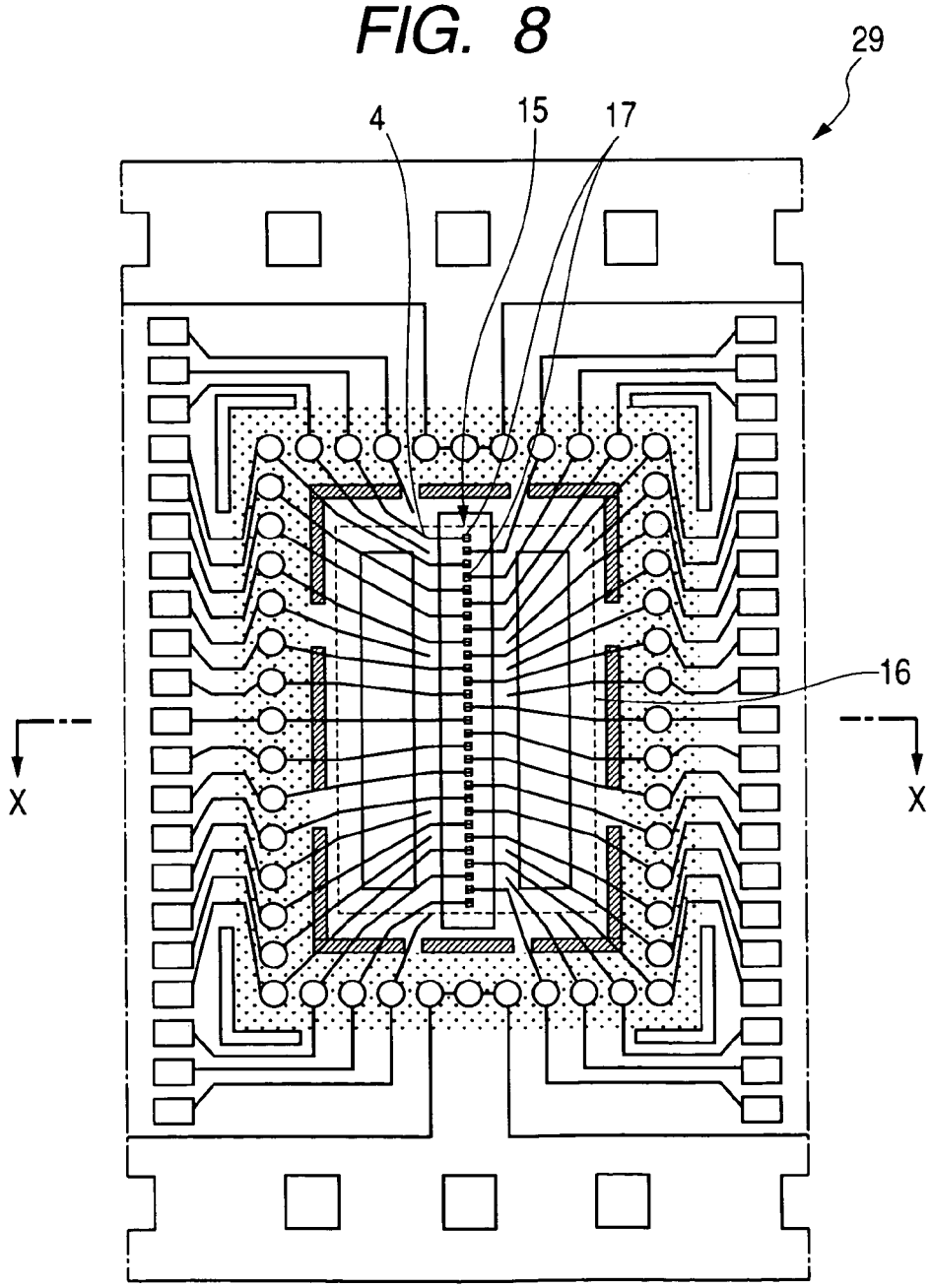
FIG. 8 is a plan view showing inner leads of the TAB tape connected to electrodes of a semiconductor chip in the process of manufacturing the semiconductor device of embodiment 1.
Figure 9:
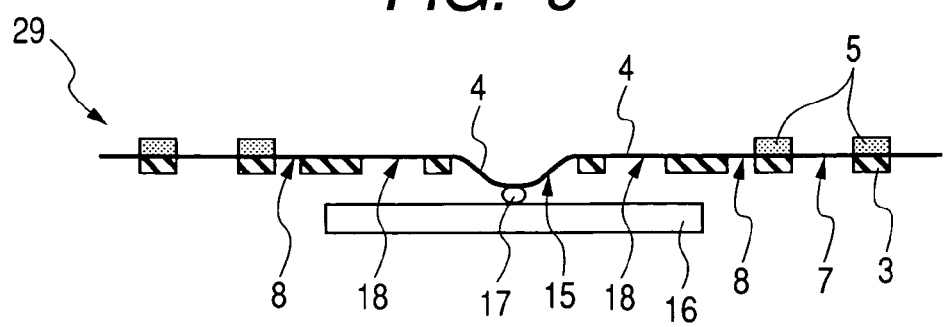
FIG. 9 is a cross-sectional view of the TAB tape and the semiconductor device taken along the line X-X of FIG. 8.
Figure 10:
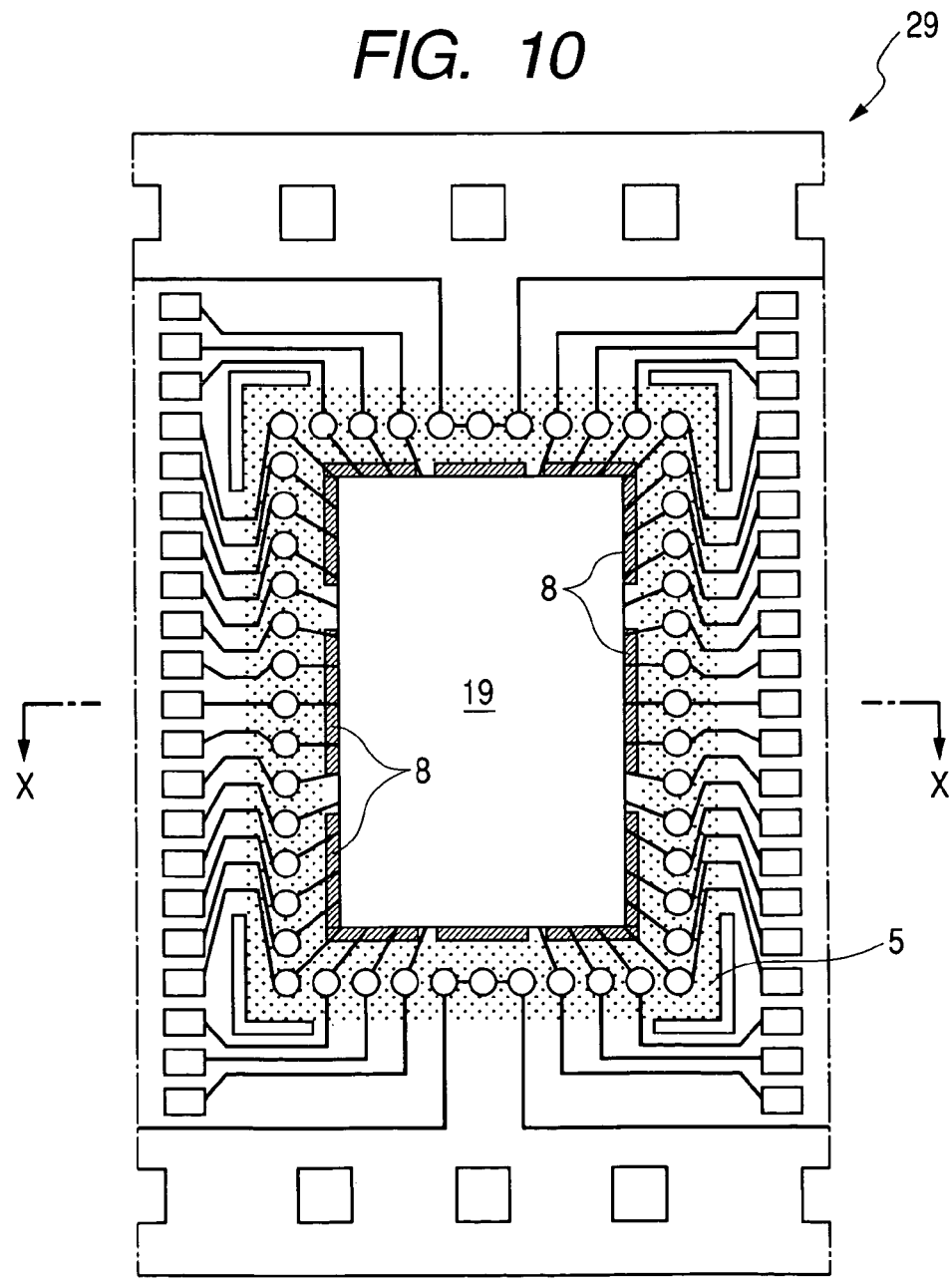
FIG. 10 is a plan view showing a sealant formed on one surface of the semiconductor chip in the process of manufacturing the semiconductor device of embodiment 1.
Figure 11:
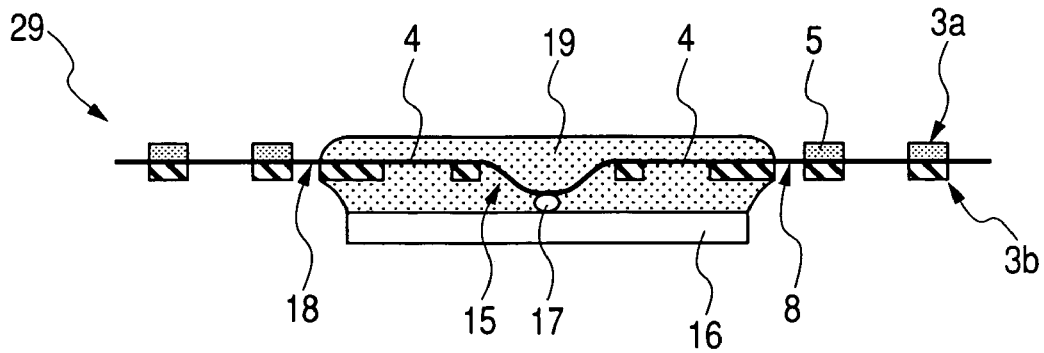
FIG. 11 is a cross-sectional view taken along the line X-X of FIG. 10.
Figure 12:
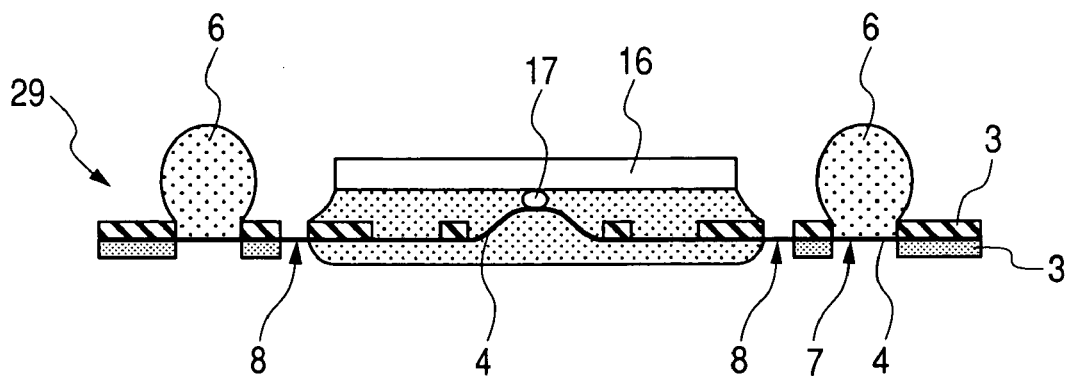
FIG. 12 is a cross-sectional view showing bump electrodes formed on the TAB tape in the process of manufacturing the semiconductor device of embodiment 1.

Now, the process of fabricating the semiconductor device 1 of the embodiment 1 will be described by referring to FIG. 5 to FIG. 12. FIGS. 5A to 5F show the manufacturing process of the semiconductor device. FIG. 6 is a plan view showing a part of a TAB tape used in the manufacture of the semiconductor device. FIG. 7 is a cross-sectional view of the TAB tape taken along the line X-X of FIG. 6. FIG. 8 and FIG. 9 are a plan view and a cross-sectional view showing inner leads of the TAB tape being connected to electrodes of a semiconductor chip. FIG. 10 and FIG. 11 are a plan view and a cross-sectional view showing an encapsulant 19 formed on the TAB tape and the semiconductor chip. FIG. 12 is a cross-sectional view showing bump electrodes 6 formed on the leads 4 in areas of the holes 7.

Figure 5A:
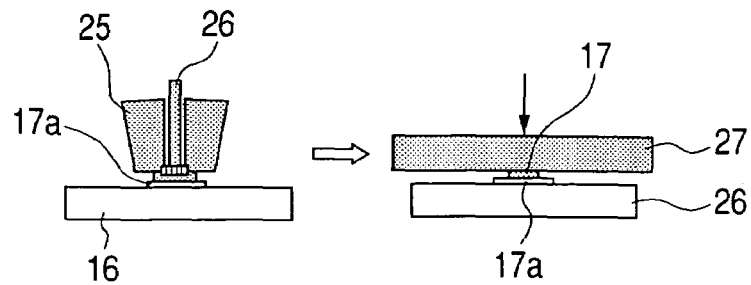
FIG. 5A to FIG. 5F are cross-sectional views showing a process of manufacturing the semiconductor device 1 of embodiment 1.

FIG. 5A illustrates the process of forming bump electrodes 17 on the main surface of the semiconductor chip 16. As shown on the left in FIG. 5A, a front end of a gold wire 26 held by a capillary 25 on a base electrode 17a on the main surface of the semiconductor chip 16 is subjected to ultrasonic bonding. The front end of the gold wire 26 is formed spherical as by discharging. The spherical portion is pressed against the base electrode 17a and subjected to ultrasonic vibrations for frictional connection with the base electrode 17a. Then, the gold wire is pulled and cut near the connected portion. Then as shown on the right in FIG. 5A, the connected portion on the base electrode 17a is flattened by a flattening tool 27 to form a protruding electrode, i.e., bump electrode 17. The base electrode 17a and the bump electrode 17 together are called an electrode 17.

Figure 5B:
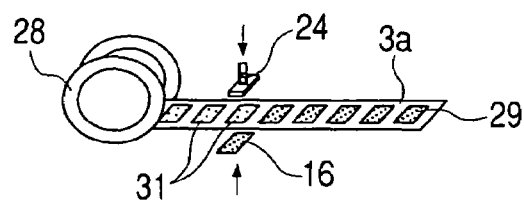

Next, as shown in FIG. 5B, a front end (inner end) of an inner lead (IL) of the TAB tape 29 is connected to the electrode 17 of the semiconductor chip 16. That is, a TAB tape 29 is fed out from a reel 28, the semiconductor chip 16 is positioned below the TAB tape 29, and a connecting tool 24 is lowered from above the TAB tape 29 to press the inner ends of the leads 4 against the electrodes 17 for connection. For example, this may be achieved, though not shown, by positioning the TAB tape 29 supplied from the reel 28 over the semiconductor chip 16 placed on a surface of a work table kept at a predetermined temperature, lowering the connecting tool 24 and ultrasonically vibrating the tool to connect the electrodes 17 of the semiconductor chip 16 to the inner ends of the leads 4 (inner lead bonding: ILB). The TAB tape 29 is moved at a predetermined pitch over the work table by a feeding mechanism.

FIG. 6 is a plan view showing a part of the TAB tape 29. FIG. 7 is a cross-sectional view taken along the line X-X of FIG. 6. FIG. 6 and subsequent figures illustrate a TAB tape portion used for the manufacture of a single semiconductor device 1.

The TAB tape 29 has a lead pattern at predetermined intervals on the first surface 3a of an elongate insulating tape 3, about 50 μm thick. The tape 3 has sprocket holes 30 on each side thereof at predetermined intervals. The tape 3 is formed of, for example, a polyimide resin film. Sprocket gears not shown engage the sprocket holes 30 and rotate at a predetermined rate to feed the TAB tape 29 at a predetermined pitch.

Between a pair of sprocket hole columns the lead patterns for the manufacture of single semiconductor devices 1 are arranged at predetermined intervals in a longitudinal direction of the TAB tape 29. The lead pattern has a test area 32 outside the pattern already described in connection with FIG. 1 (product area 31). That is, the leads 4 extend from the individual holes 7 explained in FIG. 1 toward the test area 32 on the outer side and connect to test pads 33 provided in the test area 32. The test pads 33 are also formed by etching a copper foil. The test pads 33 are arrayed in line near the edges of the TAB tape 29 on each side of the elongate device hole 15 and, during individual characteristic tests, are brought into contact with measuring terminals of characteristic test sockets.

The product area 31 is a rectangular area provided in an area where the warp prevention reinforcement 5 is provided. As shown in FIG. 6, slits 34 bent at right angles are provided at those portions on a boundary between the product area 31 and the test area 32 which correspond to the corners of the rectangular area. At the final stage of the manufacture of the semiconductor device, the tape portion between the adjacent slits 34 is cut to obtain the semiconductor device 1 shown in FIG. 1. In FIG. 6, the rectangular warp prevention reinforcement 5 indicated by dots and a portion on the inner side together form the product area 31, and a portion outside the warp prevention reinforcement 5 constitutes the test area 32.

As shown in FIG. 7, before the inner bonding is performed, the leads 4 protruding into the device hole 15 are horizontally flat. In FIG. 6 and subsequent figures, reference numbers for those parts that are already described in connection with FIG. 1 to FIG. 4 are partly omitted to make the drawings more readable. Some of the reference numbers explained in the associated drawings will be presented again in the subsequent drawings as required and some of them will be omitted.

FIG. 8 and FIG. 9 are a plan view and a cross-sectional view showing the semiconductor chip 16 mounted to the underside of the TAB tape 29 through the inner lead bonding. FIG. 9 is a cross section along the line X-X of FIG. 8.

FIG. 9 shows a state in which the inner ends of the leads 4 projecting into the device hole 15 from the left and right side are electrically connected to the electrodes 17 provided on the main surface of the semiconductor chip 16. Although in FIG. 9 it looks as if the left and right leads 4 were connected to a single electrode 17, actually a lead 4 extending from the left side connects to one electrode 17 and another lead 4 extending from the right side connects to another electrode 17 immediately behind the first electrode 17. The TAB tape 29 that has undergone the inner lead bonding is wound up on a takeup reel 40 (not shown in FIG. 5B).

In the process of mounting the semiconductor chip, although thermal stresses are applied to the tape 3 and the leads 4 due to a difference in thermal expansion coefficient between the tape 3 and the leads 4, the slits 8 and the openings 18 can disconnect and absorb the stresses, freeing the tape 3, i.e., the TAB tape 29, of deformations such as warping and twisting. Since the corner slits 8b are provided at both ends of each diagonal line of the rectangular chip mounting region, the diagonal lines representing the longest distance between any two points in the chip mounting region, the stresses are effectively absorbed and eliminated, further enhancing the effect of suppressing deformations such as warping and twisting. Because the TAB tape 29 can be prevented from being warped and twisted and thus maintain a flat state, no trouble will occur in subsequent processes.

Further, since the area outside the rectrangularly arranged slits 8 (outside-the-slits tape portion 10) is provided with the warp prevention reinforcement 5 made of a solder mask, which acts as a reinforcement member, the TAB tape 29 can be prevented from being warped or twisted and therefore remain flat. As a result, no trouble will arise in the following processes.

Figure 5C:
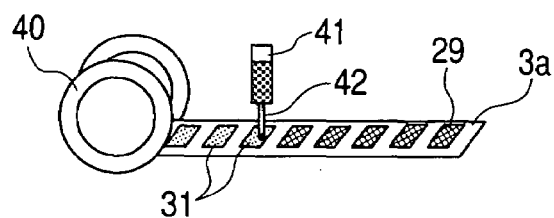

Next, as shown in FIG. 5C, as the reel 40 pays out the TAB tape 29, an insulating resin is dropped from a nozzle 42 of a dispenser 41 onto the product area 31 of the TAB tape 29 (potting). Then, the applied resin is baked for hardening. Now, the encapsulant 19 is formed.

FIG. 10 is a plan view showing the encapsulant 19 formed on the TAB tape 29 and the semiconductor chip 16. FIG. 11 is a cross section taken along the line X-X of FIG. 10. The resin dropped to the TAB tape 29 spreads over the upper surface of the tape 3 and also falls through the device hole 15 and the openings 18 to spread over the main surface of the semiconductor chip 16. The resin spreading over the tape 3 stops at the inner edge of the slits 8 by the action of the surface tension. The resins that may have entered the slits 8 stops at the outer edge of the slits 8 by the action of the surface tension. Since the width of the connecting portions 11 between the slits 8 is narrow, the resin flowing over the connecting portions 11 will also stop at portions corresponding to the inner edge of the slits 8 by the surface tension of the resin. The resin that does not stop here will stop at portions corresponding to the outer edge of the slits 8. The resin on the main surface of the semiconductor chip 16 also stops somewhere between the outer edge of the semiconductor chip 16 and the inner edge of the slits 8 of the tape 3. The degree to which the resin spreads depends on the amount of resin applied from the dispenser 41 and the viscosity of the resin. So, appropriate selections must be made. The TAB tape 29 sealed with the encapsulant 19 is then wound on the takeup reel 45 (omitted in FIG. 5C).

During the formation of the encapsulant 19, the tape 3 and the leads 4, i.e., the TAB tape 29, are subjected to thermal stresses. Further, since the resin shrinks as it hardens, stresses occur in the TAB tape 29. However, the slits 8, the openings 18 and the warp prevention reinforcement 5 can prevent the TAB tape 29 from being warped or twisted by the stresses including thermal stresses. Because the TAB tape 29 is free from warping and twisting, it can remain flat and thus does not cause any trouble in the succeeding processes. Although in FIG. 11 and subsequent cross-sectional drawings it looks as if the front ends of the leads 4 extending into the device hole 15 from both sides were connected to the same single electrode 17, the reality is that each electrode 17 is connected with only one lead 4 extending either from the left or right side.

Figure 5D:
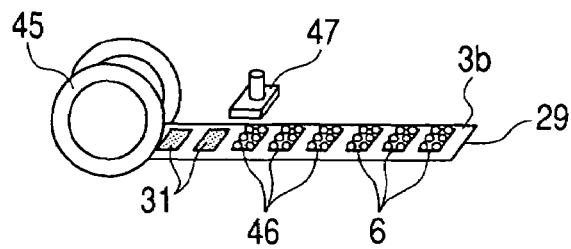
Figure 5E:
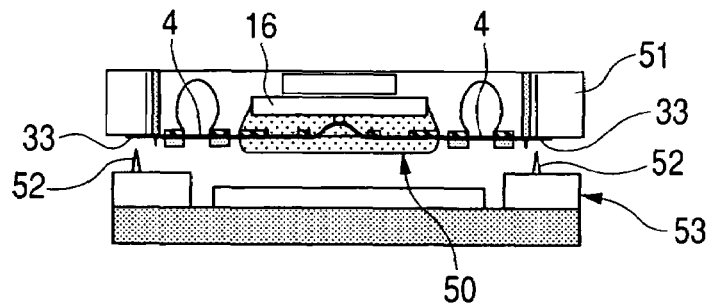

Next, the bump electrodes 6 are formed. In the formation of the bump electrodes 6, after balls are attached to the tape printed circuit board 2 to form the bump electrodes 6, the board is washed to remove flux. As shown in FIG. 5D, the TAB tape 29 is supplied from the reel 45. In the preceding process, the TAB tape 29 is wound on the reel 45 so that the upper surface of the unwounded tape 3 will be the second surface 3b.

A ball holder 47 that can hold a plurality of balls 46 at its bottom surface by suction is used to hold the balls 46. The ball holder 47 holds the balls 46 at its bottom surface by suction at positions corresponding to the locations of the holes 7 explained in FIG. 1 and FIG. 4. As shown in FIG. 5D, the balls 46 are positioned and placed on the individual product areas 31 of the TAB tape 29. Then, the balls are reflowed, though not shown, for secure connection on the TAB tape 29. As a result, the balls 46 become bump electrodes 6. The tape is then cleaned, though not shown, to wash away unwanted substances such as flux adhering to the bump electrodes 6 and the TAB tape 29. FIG. 12 is a cross section showing the bump electrodes 6 formed on the leads 4 in the holes 7.

During the formation of the bump electrodes 6, the tape 3 and the leads 4, i.e., the TAB tape 29, are subjected to thermal stresses. However, the slits 8, the openings 18 and the warp prevention reinforcement 5, as described above, can prevent the TAB tape 29 from being warped or twisted by the thermal stresses. Because the TAB tape 29 is free from warping and twisting, it can remain flat and thus does not cause any trouble in the succeeding processes.

Next, the TAB tape 29 is cut at predetermined intervals into individual pieces 50, which are then mounted in a receptor 51 of a characteristic inspection socket. The receptor 51 is stacked on a body 53, which has measuring needles 52 protruding from its upper surface, to bring the measuring needles 52 into contact with the associated test pads 33 for predetermined characteristic inspections.

Figure 5F:
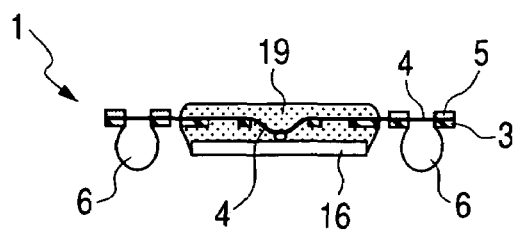

Next, the piece 50 is trimmed to remove excess TAB tape portions to produce a semiconductor device 1 as shown in FIG. 5F. With the TAB tape 29 trimmed, the TAB tape 29 in the product area 31 becomes a tape printed circuit board 2.

Figure 13:
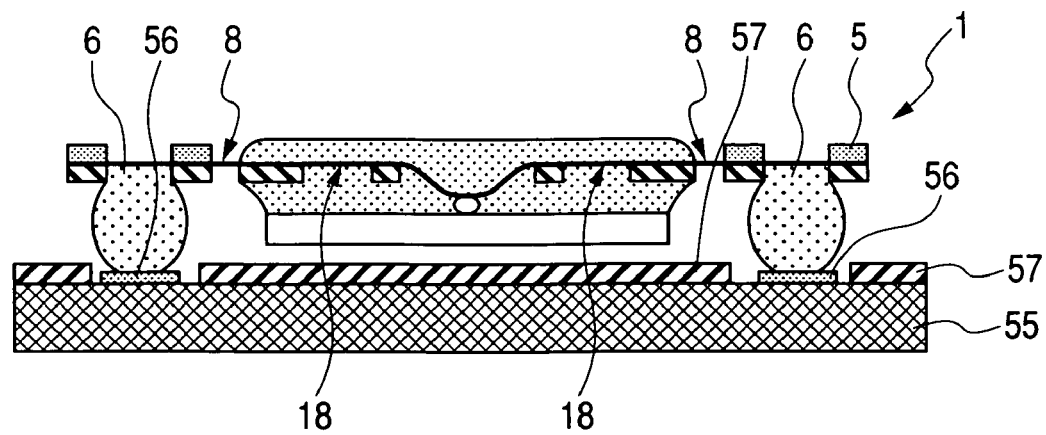
FIG. 13 is a cross-sectional view showing the semiconductor device of embodiment 1 mounted on a mounting board.

The semiconductor device 1 thus obtained is mounted on a mounting board 55, as shown in FIG. 13. On the upper surface of the mounting board 55, there are lands 56. These lands 56 are provided at locations that match the positions of the bump electrodes 6 on the semiconductor device 1. Other areas on the upper surface of the mounting board 55 where the lands 56 are not provided are covered with an insulating film 57. In the mounting process, the semiconductor device 1 is placed on the mounting board 55 so that the bump electrodes 6 rest on the lands 56 of the mounting board 55. Then, solders provided on the surface of the lands 56 are reflowed to electrically connect the bump electrodes 6 to the lands 56.

During this mounting process, the semiconductor device 1 is subjected to thermal stresses. However, the thermal stresses are absorbed and eliminated, as explained above, by the slits 8, the openings 18 and the warp prevention reinforcement 5, preventing deformations, such as warping and twisting, of the semiconductor device 1. This in turn allows the bump electrodes 6 to be connected reliably to the lands 56 of the mounting board 55, thereby enhancing the reliability of the mounting process of the semiconductor device 1.

FIG. 14 to FIG. 18 are cross-sectional views of semiconductor devices representing variation 1 to variation 5 of the embodiment 1.

Figure 14:
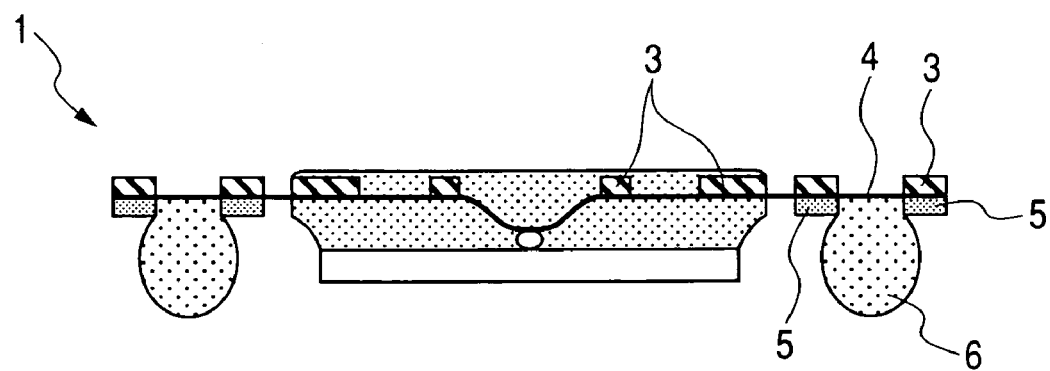
FIG. 14 is a cross-sectional view of a semiconductor device as variation 1 of embodiment 1.

FIG. 14 is a cross-sectional view of a semiconductor device as variation 1. The semiconductor device 1 has the tape 3 on the upper surface of the leads 4 and the warp prevention reinforcement 5 on the lower surface, in contrast to the embodiment 1. The warp prevention reinforcement 5 is formed of a solder resist film (solder mask). The warping and twisting prevention effect is similar to that of the embodiment 1.

Figure 15:
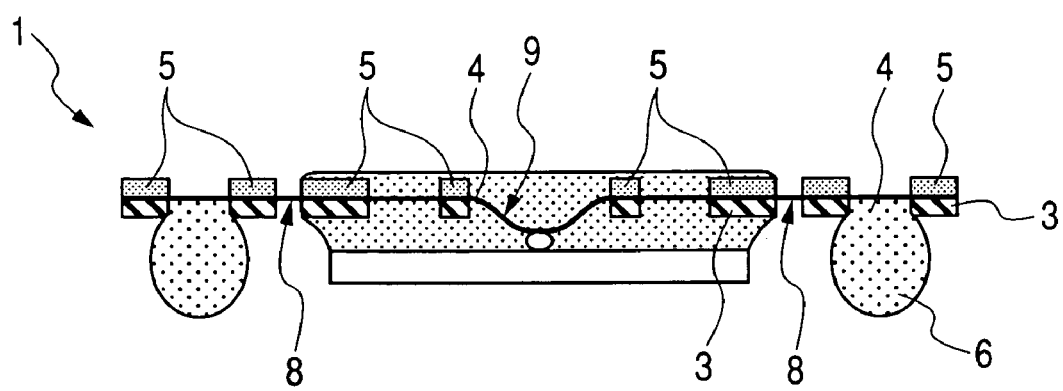
FIG. 15 is a cross-sectional view of a semiconductor device as variation 2 of embodiment 1.

FIG. 15 is a cross-sectional views of a semiconductor device as variation 2. In this semiconductor device 1, the warp prevention reinforcement 5 is also provided in an area inside the slits 8, i.e. the inside-the-slits tape portion 9, in such a manner that it overlaps the tape 3. The warp prevention reinforcement 5 is formed of a solder resist film. The warping and twisting prevention effect is greater than that of the embodiment 1. In this variation 2, the inner circumferential surface of the hole 7 is formed narrower on the lead side and wider away from the lead 4 toward the tape surface. While this structure may be realized by differentiating hole diameters in two tapes, this variation has the inner circumferential surface of the hole tapered. This arrangement is expected to improve the solderability.

Figure 16:
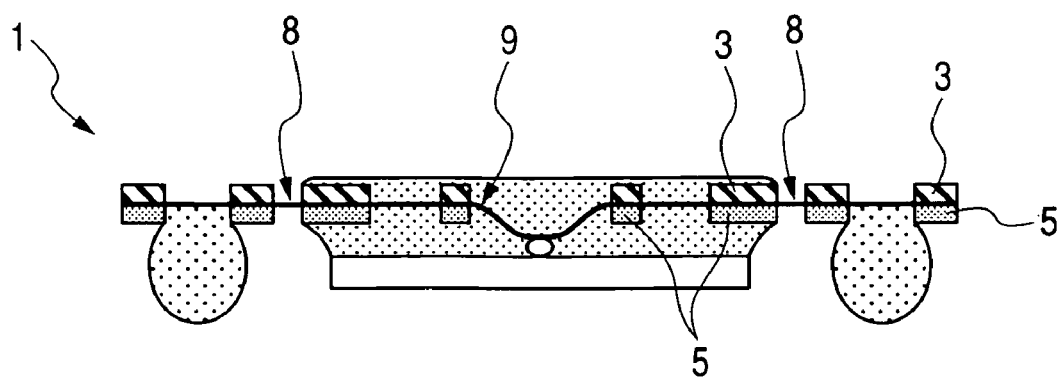
FIG. 16 is a cross-sectional view of a semiconductor device as variation 3 of embodiment 1.

FIG. 16 is a cross-sectional view of a semiconductor device as variation 3. This semiconductor device 1 has the vertical positions of the tape 3 and the warp prevention reinforcement 5 inverted from those in the semiconductor device 1 of the variation 2, with the tape 3 provided on the upper surface of the leads 4 and the warp prevention reinforcement 5 on the lower surface of the leads 4. The warp prevention reinforcement 5 is formed of a solder resist film. The warping and twisting prevention effect is similar to that of variation 2.

Figure 17:
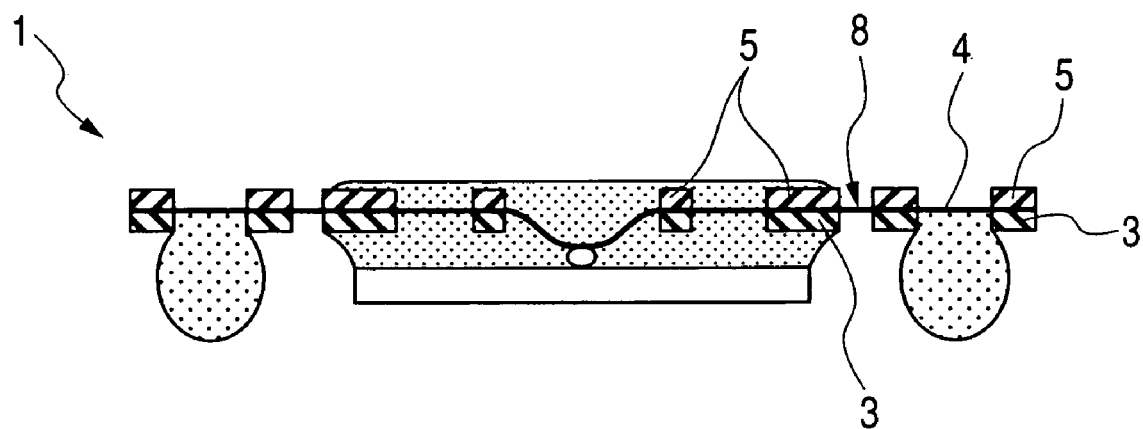
FIG. 17 is a cross-sectional view of a semiconductor device as variation 4 of embodiment 1.

FIG. 17 is a cross-sectional view of a semiconductor device as variation 4. This semiconductor device 1 is similar to the one in variation 2 except that the warp prevention reinforcement 5 is formed of an insulating resin tape. Since the resin tape is used, the warp prevention reinforcement 5 has a greater strength than the solder resist film and therefore a higher warping and twisting prevention effect.

Figure 18:
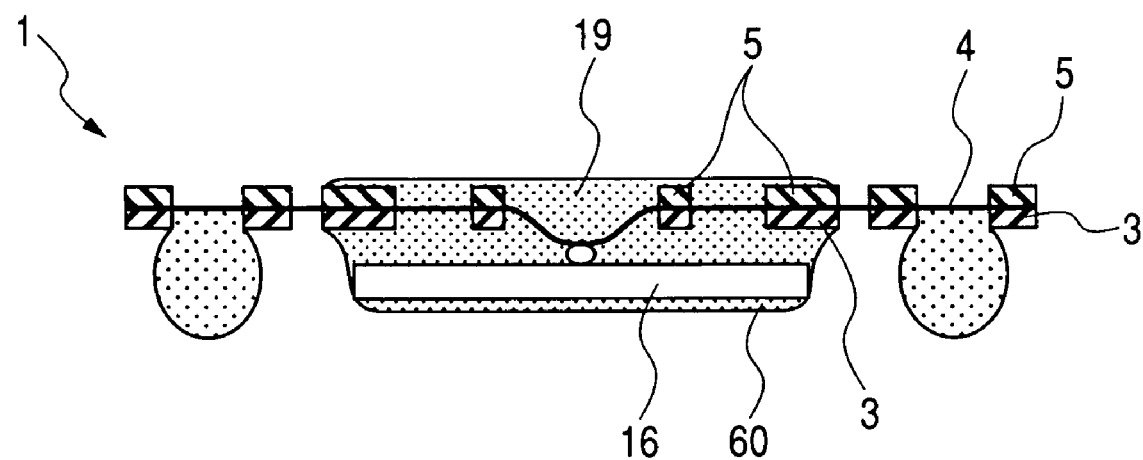
FIG. 18 is a cross-sectional view of a semiconductor device as variation 5 of embodiment 1.

FIG. 18 is a cross-sectional view of a semiconductor device as variation 5. This variation is characterized in that an insulating resin layer 60 is also formed on the underside of the semiconductor chip 16. This enhances the warping and twisting prevention effect and also a humidity resistance of the semiconductor device 1 because the semiconductor chip 16 is enclosed almost entirely with a resin.

The semiconductor device 1 has the following advantages.

(1) Since the slits 8 are provided between the encapsulant 19 and the columns of the bump electrodes 6, if thermal stresses caused by material differences are applied to the tape 3 (tape printed circuit board 2), they are absorbed and eliminated by the slits 8, making the warping and twisting of the semiconductor device 1 unlikely. As a result, the semiconductor device 1 can be mounted accurately and reliably on the mounting board 55 through the bump electrodes 6. It should be noted that the angled slits 8 (corner slits 8b) are provided at positions corresponding to the corners of the encapsulant 19. Because the corner slits 8b are provided at the ends of each diagonal line connecting the corners of the encapsulant 19 and the diagonal lines represent the longest length of the tape, the warping and twisting of the tape 3 or semiconductor device 1 hardly occurs.

(2) Because the warp prevention reinforcement 5 formed of a solder resist film is provided outside the slits 8, i.e. in a tape portion outside the encapsulant 19, the semiconductor device 1 hardly produces warping or twisting, allowing for a precise and reliable mounting of the semiconductor device 1. Further, in the semiconductor device 1 that has the warp prevention reinforcement 5 arranged to overlap the tape 3 over the area inside and outside the slits 8, the warping and twisting prevention effect is further enhanced.

(3) As described in (1) and (2) above, since the slits 8 are formed in the semiconductor device 1 between the encapsulant 19 and the columns of the bump electrodes 6 and the warp prevention reinforcement 5 formed of a solder resist film is provided in the tape portion outside the slits 8 (encapsulant 19), the semiconductor device 1 hardly produces the warping and twisting, ensuring a precise and reliable mounting of the semiconductor device 1.

(4) On one and the same surface side of the leads 4 supported on one surface of the tape 3, there are provided the semiconductor chip 16 and the bump electrodes 6. The encapsulant 19 is formed on a surface side of the semiconductor chip 16 where the chp is connected to the leads 4. This construction makes the semiconductor device 1 thin. For example, the height of the semiconductor device 1 can be made less than 0.5 mm.

(5) During the formation of the encapsulant 19, even if a resin of the encapsulant 19 flows, the resin flow stops at the inner edge or outer edge of the slits 8 because of the surface tension of the resin. Thus, the encapsulant 19 formed is well defined and shaped and has good appearance.

Embodiment 2

Figure 19:
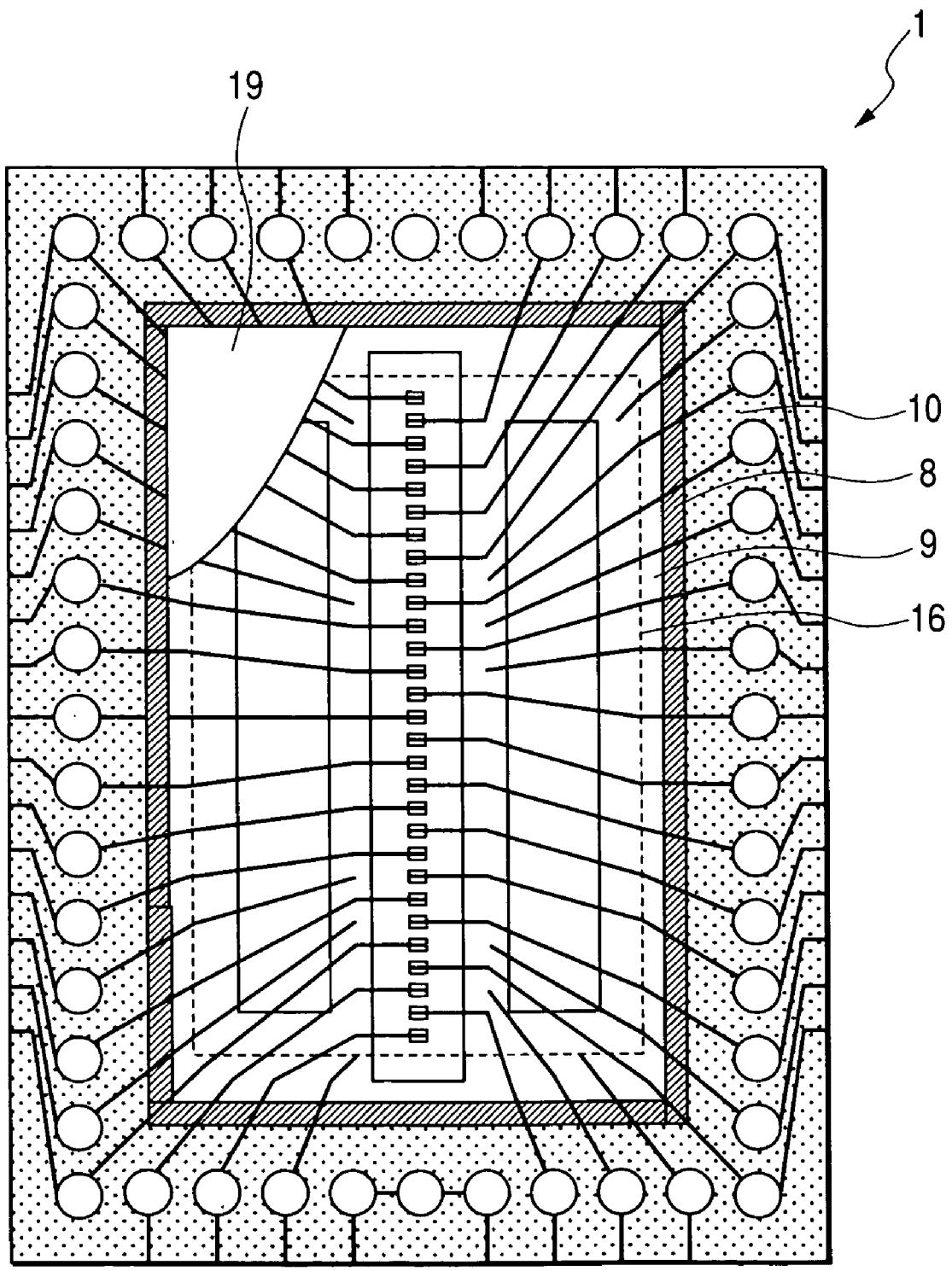
FIG. 19 is a plan view of a semiconductor device 1 according to embodiment 2 of this invention.
Figure 20:
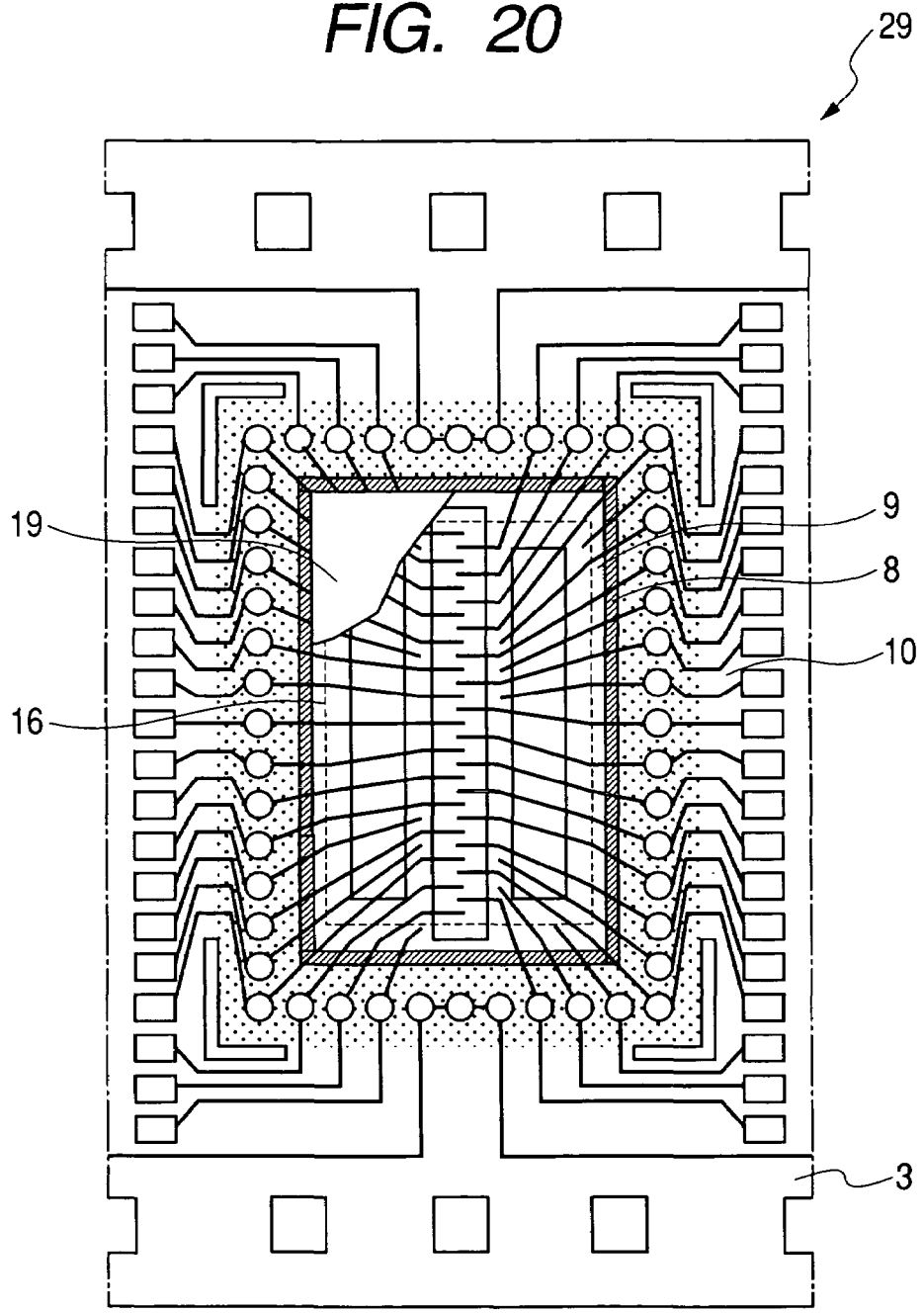
FIG. 20 is a plan view showing a part of a TAB tape used in the manufacture of the semiconductor device of embodiment 2.

FIG. 19 and FIG. 20 show a semiconductor device according to embodiment 2, FIG. 19 representing a plan view of the semiconductor device and FIG. 20 representing a plan view of a part of a TAB tape used in the manufacture of the semiconductor device.

As shown in FIG. 19, the semiconductor device 1 of the embodiment 2 has a slit 8 formed along an entire circumference of the semiconductor chip 16. Because the slit 8 is provided along the whole circumference, if stresses such as thermal stresses are applied to the tape (tape printed circuit board 2), the stresses are completely disconnected between the areas inside and outside the slit 8. This minimizes strains. And because the slit absorbs the stresses, distortions such as warping and twisting can be prevented.

In the fabrication of the semiconductor device 1 of embodiment 2, a TAB tape 29 such shown in FIG. 20 is used. The tape portion 9 inside the rectrangularly arranged slit 8 and the tape portion 10 outside the slit 8 are completely separated by the slit 8. However, the inside-the-slit tape portion 9 and the outside-the-slit tape portion 10 are connected together through a number of leads 4 and also supported by them. So, no problem will arise in the fabrication process of the semiconductor device 1.

During the manufacture of the semiconductor device 1, since the slit 8 is formed continuously, the entire resin stops at the edge of the slit 8, thus making the outline of the encapsulant 19 well defined and shaped, giving it a good appearance.

Embodiment 3

Figure 21:
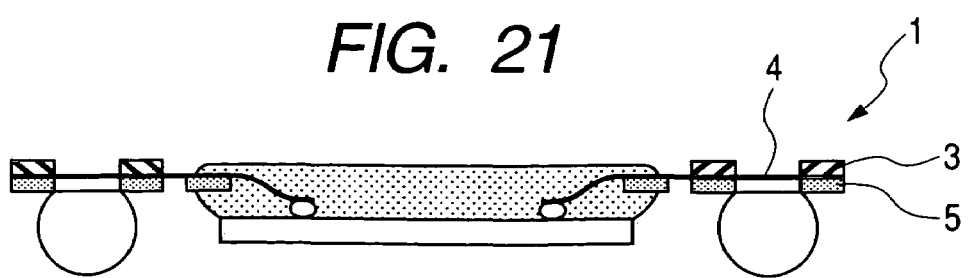
FIG. 21 is a cross-sectional view of a semiconductor device with a peripheral pad structure according to embodiment 3 of this invention.
Figure 22:
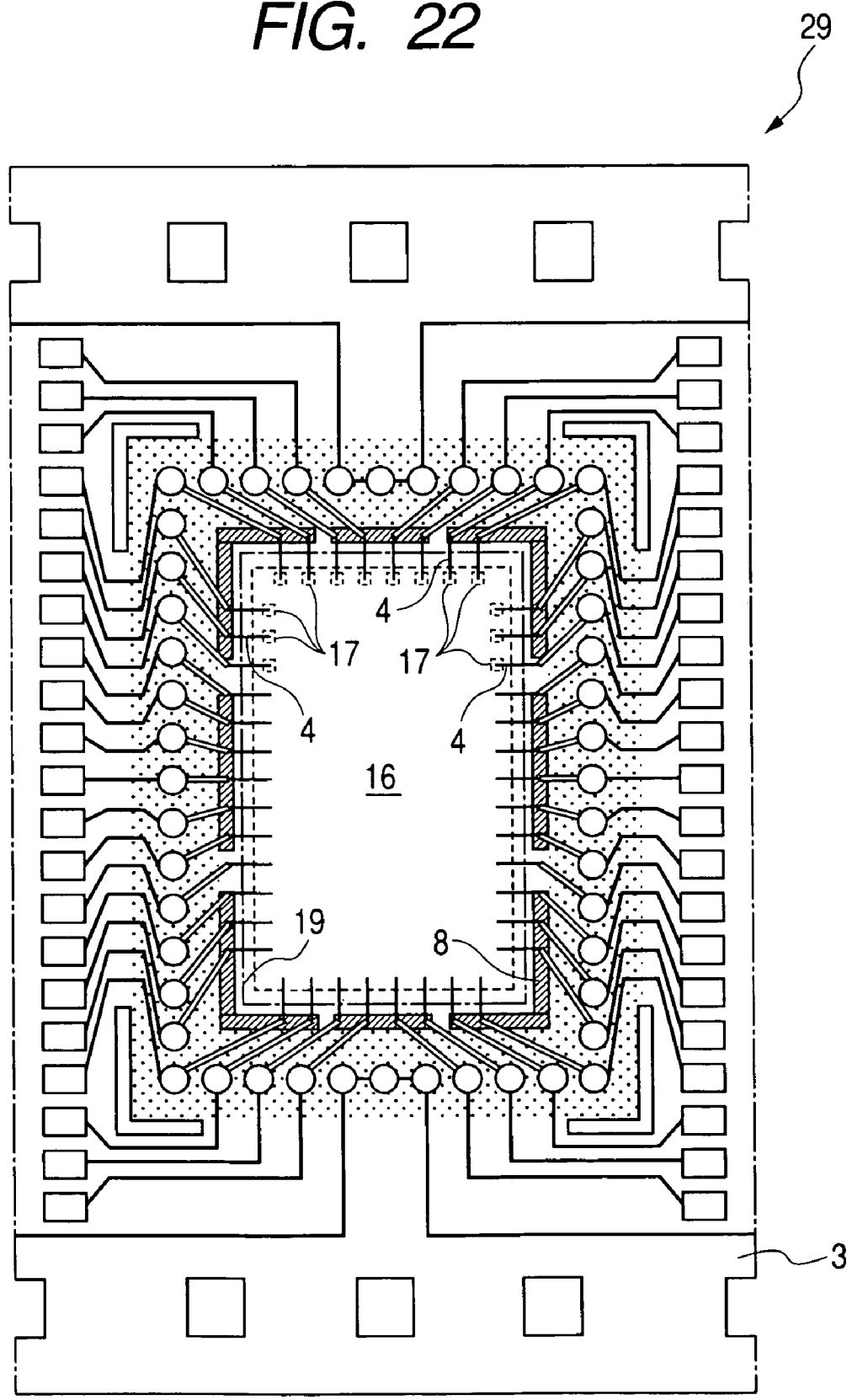
FIG. 22 is a plan view showing a part of a TAB tape used in the manufacture of peripheral pad type semiconductor device of embodiment 3.

FIG. 21 and FIG. 22 illustrate as embodiment 3 a semiconductor device with a peripheral pad structure, FIG. 21 representing a cross-sectional view of the semiconductor device and FIG. 22 representing a plan view of a part of a TAB tape used in the manufacture of the semiconductor device.

The embodiment 3 concerns a case in which this invention is applied to a semiconductor device 1 incorporating a semiconductor chip with a peripheral pad structure. As shown in FIG. 22, on the main surface of a rectangular semiconductor chip 16, a line of electrodes 17 is arranged along and near each side of the semiconductor chip 16. The TAB tape 29 therefore is characterized by a construction in which the device hole 15 in the TAB tape 29 of embodiment 1 is widened beyond the areas of the openings 18. Front ends of the leads 4 protruding into the device hole 15 are connected to the associated electrodes 17 (see FIG. 21).

This embodiment 3 also is provided with the slits 8 and with the warp prevention reinforcement 5 in the tape portion 10 outside the slits 8. Because of this arrangement, the warping and twisting of the TAB tape 29 and the tape printed circuit board 2 (tape 3) can be prevented.

Figure 23:
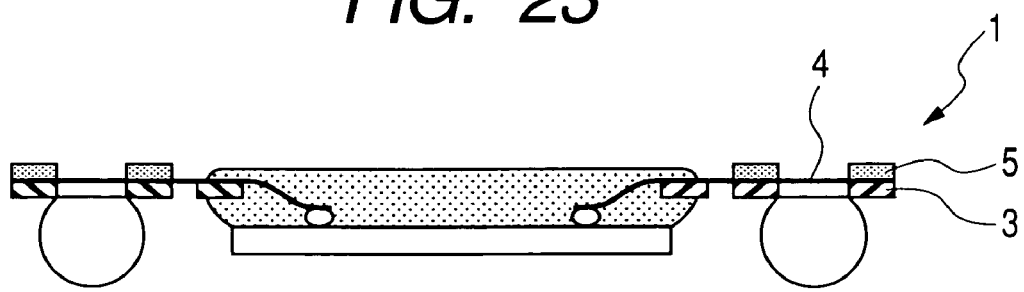
FIG. 23 is a cross-sectional view of a peripheral pad type semiconductor device as a variation of embodiment 3.

FIG. 23 is a cross-sectional view showing, as a variation of embodiment 3, a semiconductor device with a peripheral pad structure. While in embodiment 3 the tape 3 is situated on the upper surface of the leads 4 and the warp prevention reinforcement 5 is situated on the bottom surface of the leads 4, this variation reverses this relation, that is, the tape 3 is situated on the bottom surface of the leads 4 and the warp prevention reinforcement 5 is situated on the upper surface. In this variation, too, the same effect as embodiment 3 can be obtained.

Embodiment 4

Figure 24:
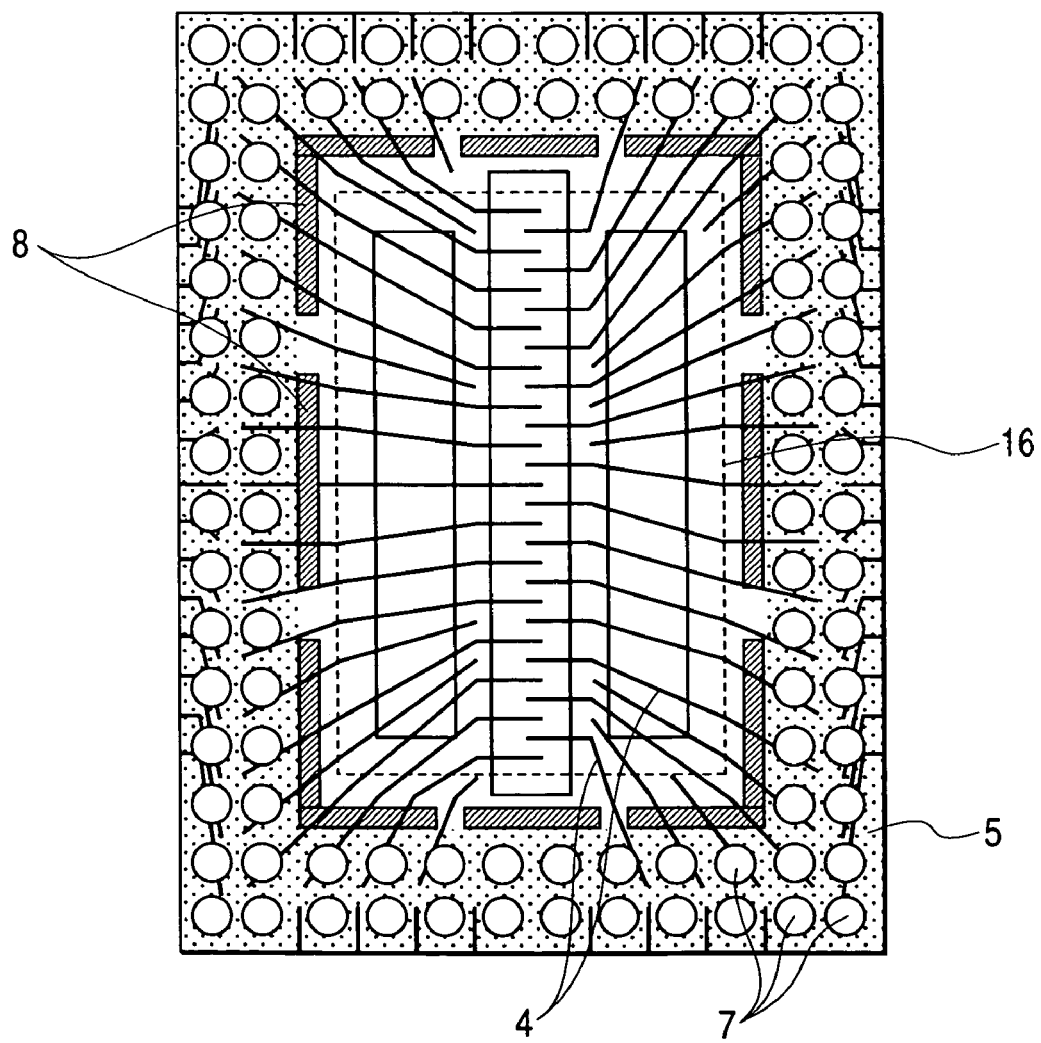
FIG. 24 is a plan view of a semiconductor device with a double pad structure according to embodiment 4 of this invention.
Figure 25:
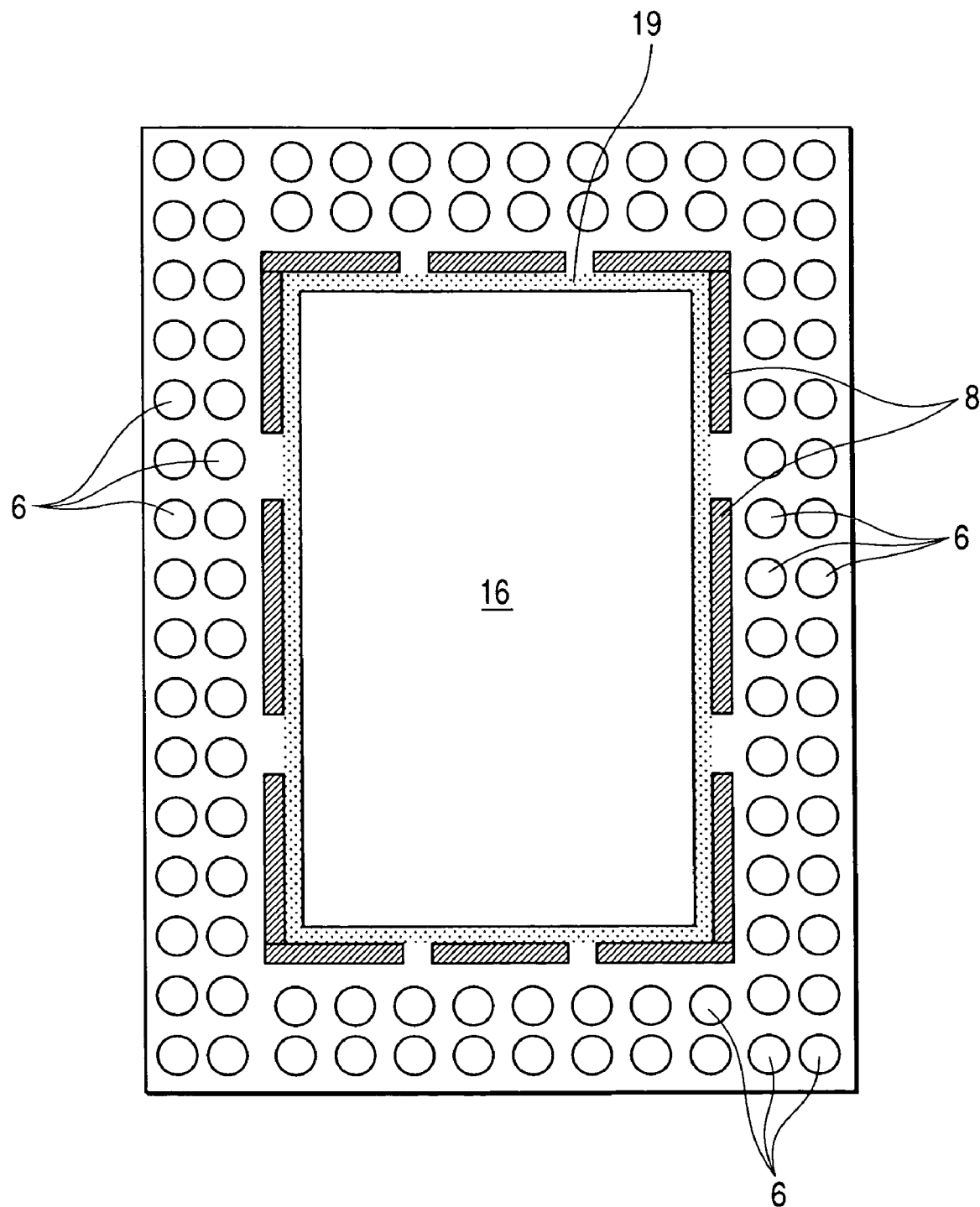
FIG. 25 is a bottom view of the double column pad type semiconductor device of embodiment 4.
Figure 26:
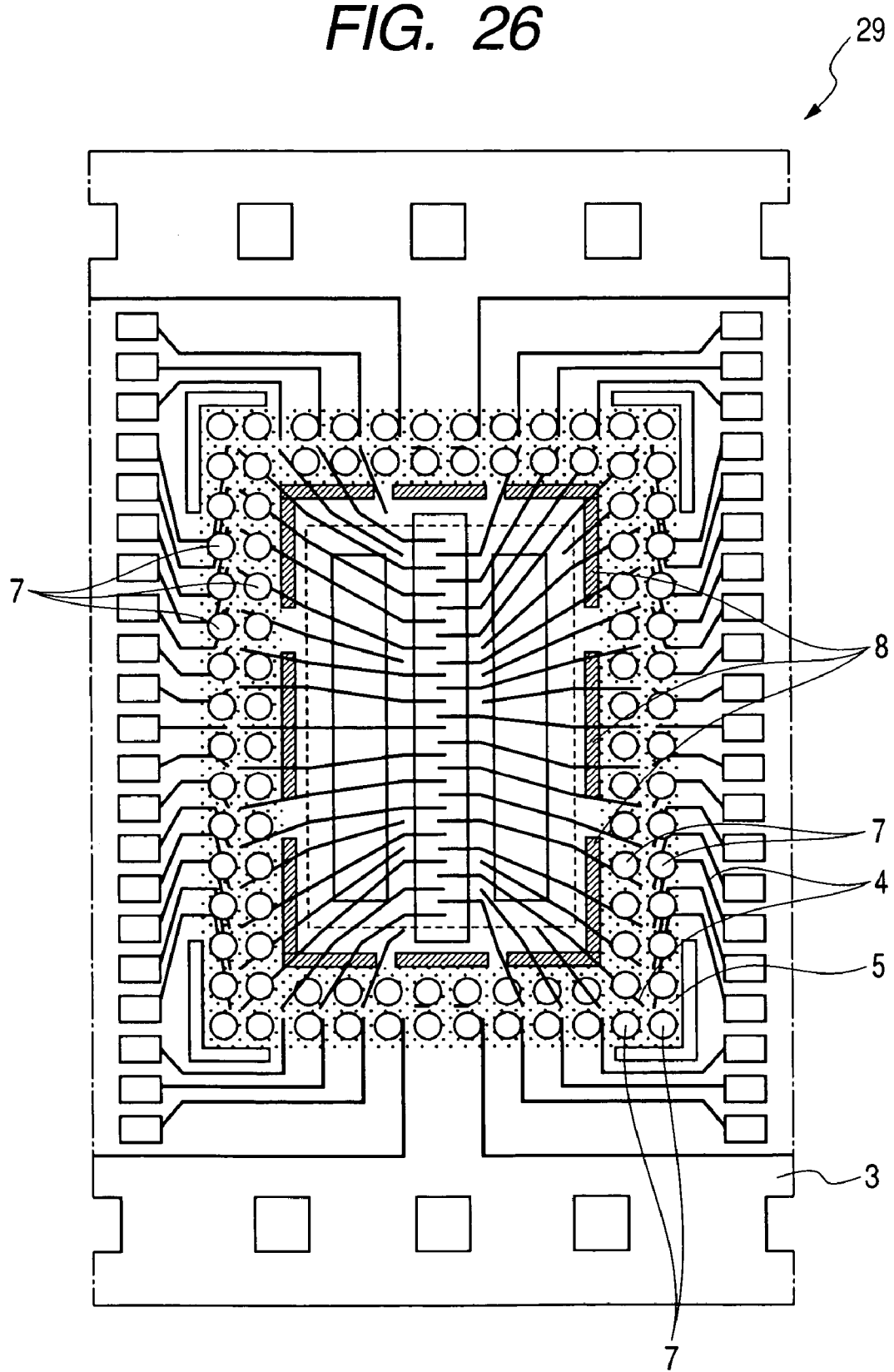
FIG. 26 is a plan view showing a part of a TAB tape used in the manufacture of the double column pad type semiconductor device of embodiment 4.

FIG. 24 to FIG. 26 concern a semiconductor device with a double column pad structure as embodiment 4. FIG. 24 is a plan view of the semiconductor device, FIG. 25 is a bottom view of the semiconductor device, and FIG. 26 is a plan view showing a part of the TAB tape used in manufacturing the semiconductor device.

As shown in FIG. 24 and FIG. 25, the semiconductor device 1 of embodiment 4 has two columns of bump electrodes 6 formed outside the rectrangularly arranged slits 8. In fabricating the semiconductor device 1 of embodiment 4, two columns of holes 7 are formed outside the rectrangularly arranged slits 8, as shown in FIG. 26. The leads 4 pass through the holes 7. The bump electrodes 6 are formed, for example, on the second surface 3b of the tape 3. With this arrangement a multi-pin semiconductor device 1 free from warping and twisting can be provided.

It is also possible to add another column of bump electrodes 6. The bump electrodes 6 may also be arranged in a staggered pattern. The staggered arrangement allows the columns of the bump electrodes 6 to be put closer together than an arrangement in which two bump electrodes 6 are placed in parallel. The staggered arrangement therefore can achieve a size reduction of the semiconductor device 1.

Embodiment 5

Figure 27:
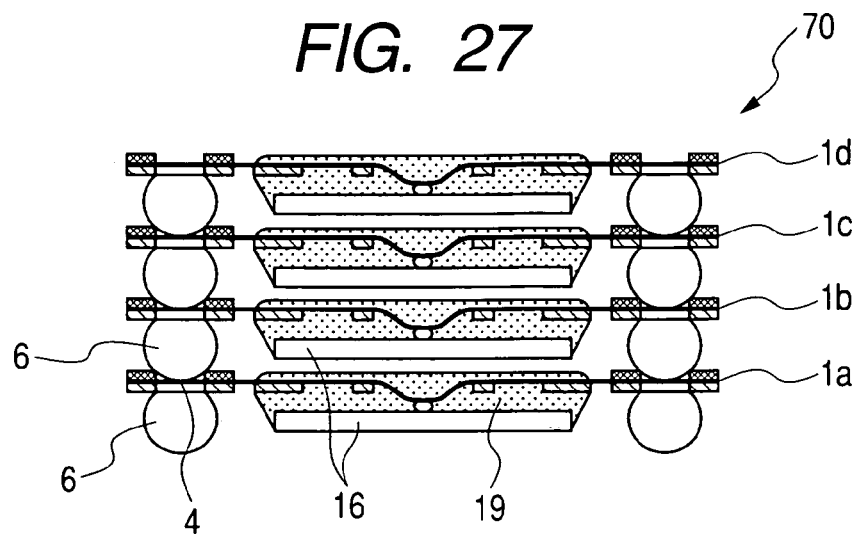
FIG. 27 is a cross-sectional view of a semiconductor device with a multi-tiered structure according to embodiment 5 of this invention.
Figure 28:
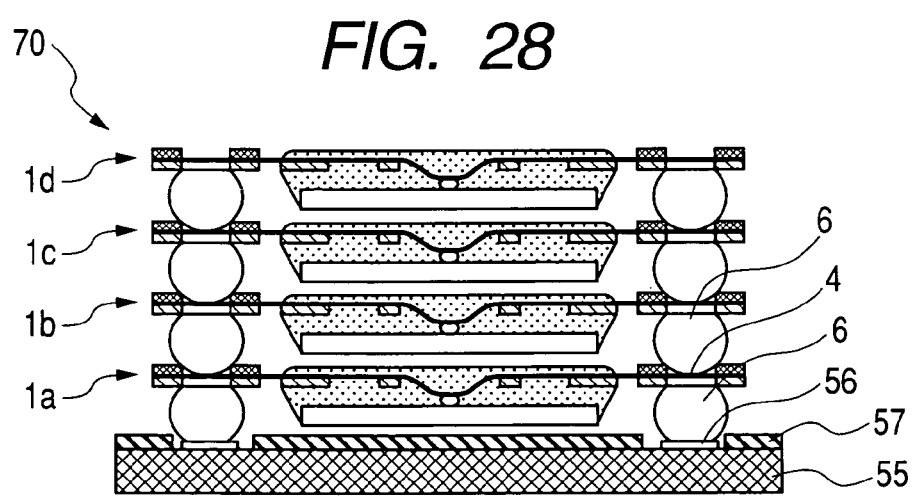
FIG. 28 is a cross-sectional view showing the multi-tier type semiconductor device in a mounted state.

FIG. 27 is a cross-sectional view showing, as embodiment 5, a semiconductor device with a multi-tier structure. FIG. 28 is a cross-sectional view showing the multi-tier type semiconductor device in a mounted state.

The multi-tier type semiconductor device 70 of embodiment 5 is a semiconductor device having four of the semiconductor devices 1 of embodiment 1 stacked and connected together. That is, four semiconductor devices 1a-1d are prepared and then the semiconductor 1b is put on the semiconductor device 1a; the semiconductor device 1c is placed on the semiconductor device 1b; and the semiconductor device 1d is placed on the semiconductor device 1c. In the stacking process, the bump electrodes 6 of the upper tier semiconductor device are positioned to overlap the leads 4 running through the holes 7 of the lower tier semiconductor device and then stacked on the associated leads. Then, they are reflowed to electrically connect the leads 4 and the bump electrodes 6 to fabricate the multi-tier type semiconductor device 70.

FIG. 28 illustrates an example of the multi-tier type semiconductor device 70 mounted on the mounting board 55. The bump electrodes 6 of the lowermost tier semiconductor device 1a of the multi-tier type semiconductor device 70 are electrically connected to the lands 56 of the mounting board 55.

Since the multi-tier type semiconductor device 70 of embodiment 5 uses good semiconductor devices 1 manufactured in embodiment 1 that are free from warping and twisting, the vertically adjoining semiconductor devices are electrically connected reliably, forming a multi-tier type semiconductor device 70 with good mounting performance.

The semiconductor devices 1 therefore can be stacked in any desired number of tiers, making it possible to manufacture the multi-tier type semiconductor device 70 at low cost.

The multi-tier type semiconductor device 70 comprises multiple tiers of thin semiconductor devices 1, which means that a thin multi-tier type semiconductor device 70 can be provided.

Because the multi-tier type semiconductor device 70 uses only the semiconductor devices 1 that have passed a characteristic test, a failure rate can be reduced.

Figure 29:
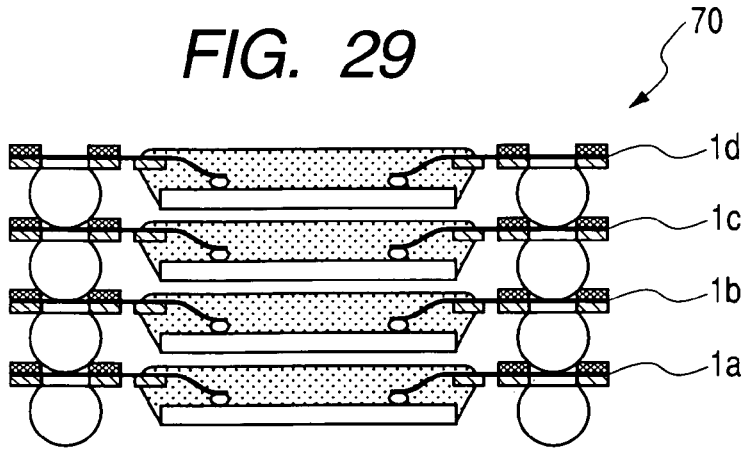
FIG. 29 is a cross-sectional view showing a multi-tier type semiconductor device as variation 1 of embodiment 5.

FIG. 29 is a cross-sectional view showing a multi-tier type semiconductor device as variation 1 of embodiment 5. In the figure, the semiconductor devices 1a-1d all use, as a semiconductor chip, a center pad chip in which electrodes are arrayed along the center on the main surface. With such a multi-tier type semiconductor device, it is possible to increase a capacity by stacking chips of the same shape or of the same type.

Figure 30:
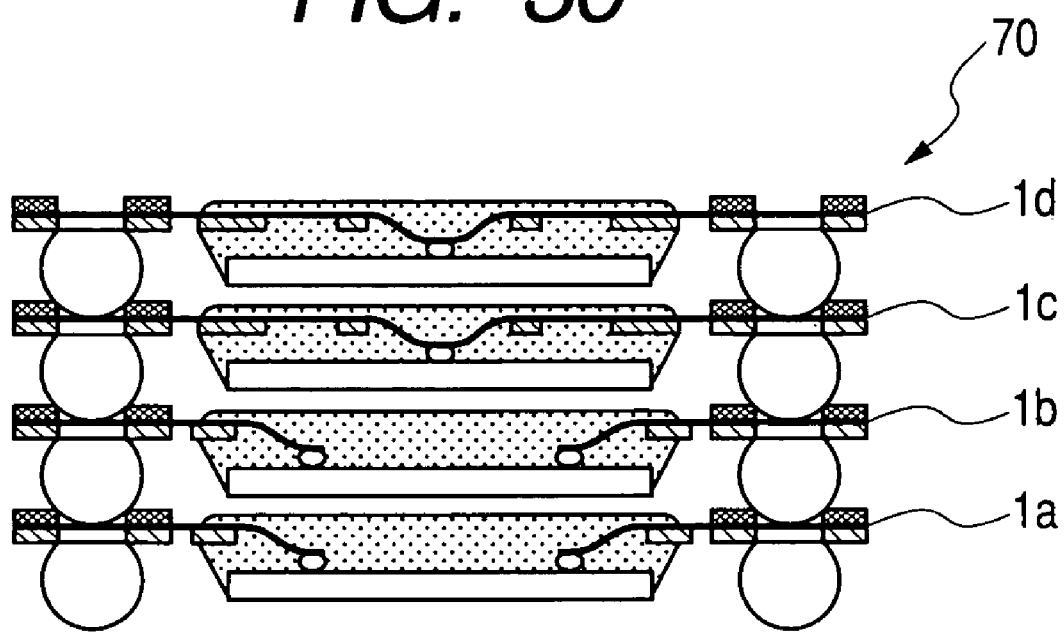
FIG. 30 is a cross-sectional view showing a multi-tier type semiconductor device as variation 2 of embodiment 5.
Figure 31:
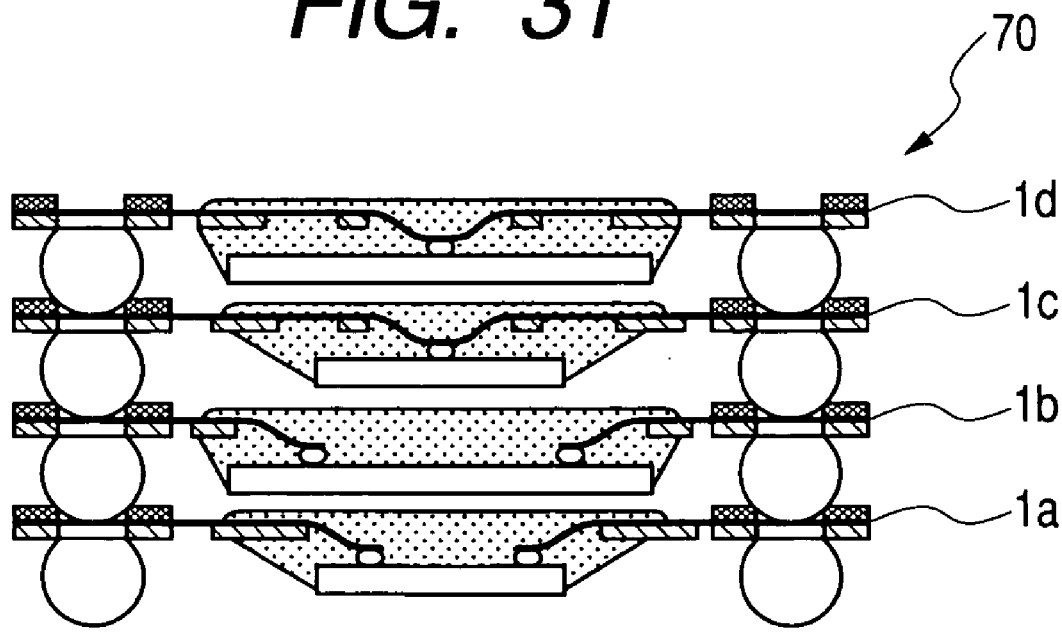
FIG. 31 is a cross-sectional view showing a multi-tier type semiconductor device as variation 3 of embodiment 5.

FIG. 30 and FIG. 31 are cross-sectional views showing multi-tier type semiconductor devices as variation 2 and variation 3 of embodiment 5, respectively. In these variations, some of the stacked semiconductor devices 1a-1d use as a semiconductor chip a center pad chip in which electrodes are arrayed along the center on the main surface and the others use a side pad chip in which electrodes are arrayed along edges of the main surface.

FIG. 30 shows the semiconductor devices 1a, 1b incorporating the side pad chip and the semiconductor devices 1c, 1d incorporating the center pad chip. The capacity can be increased by stacking chips of the same shape or of the same type. This arrangement is advantageous in mounting composite chips.

FIG. 31 shows another structure in which 1a is a semiconductor device incorporating a small side pad chip, in which 1b is a semiconductor device incorporating a larger side pad chip than that of the semiconductor device 1a, in which 1c is a semiconductor device incorporating a small center pad chip, and in which 1d is a semiconductor device incorporating a larger center pad chip than that of the semiconductor device 1c. This arrangement is advantageous in mounting composite chips.

We have described embodiments of this invention in detail. It is noted however that this invention is not limited to the above embodiments and that various modifications may be made without departing from the spirit of the invention.

The invention claimed is:

1. A semiconductor device comprising:
  an insulating tape having a first surface, a second surface opposite the first surface, an opening penetrating the insulating tape, a plurality of holes, an elongated slit zone formed with a continuous slit or a plurality of serially arranged slits disposed between said opening and said plurality of holes, an inner area surrounded by said elongated slit zone, and an outer area separated from said inner area by said elongated slit zone, said opening being disposed at said inner area, said plurality of holes being disposed at said outer area along peripheries of the tape;

a plurality of leads formed on one of the first and second surfaces of the tape so that each of said plurality of leads includes a portion suspended at said opening and reaches into a corresponding one of said plurality of holes;

a semiconductor chip having a plurality of electrodes on a main surface thereof, the semiconductor chip being disposed within said inner area so that the electrodes are exposed to said opening and connected with the suspended portions of the corresponding leads at said opening;

an encapsulant comprised of an insulating resin so as to cover the main surface of the semiconductor chip, the leads and a portion of the tape on said inner area and so as to fill said opening but to expose said slit zone and said plurality of holes;

bump electrodes provided on the leads extending out of the holes so that the semiconductor chip and the bump electrodes are disposed on the same surface side of the leads and so that tops of the bump electrodes project from the holes over the thickness of the semiconductor chip; and at least one layer of an insulating material formed on the outer area of the tape in a manner to expose the slit zone and the surfaces of said leads in said holes on which surfaces said bump electrodes are not formed, wherein the semiconductor chip is rectangular-shaped, the encapsulant enclosing the semiconductor chip is also rectangular-shaped, and said elongated slit zone is provided in a manner to be bent along the corners of the encapsulant.

2. A semiconductor device according to claim 1, wherein a periphery of the encapsulant is bordered by said serially arranged slits.

3. A semiconductor device according to claim 1, wherein a periphery of the encapsulant is bordered by said continuous slit.

4. A semiconductor device according to claim 1, Further comprising layers of the insulating material formed on the inner area of the tape.

5. A semiconductor device according to claim 1, wherein said layer of the insulating material is comprised of a solder resist film.

6. A semiconductor device according to claim 1, wherein said layer of the insulating material is comprised of a resin tape.

7. A semiconductor device according to claim 1, wherein the tape is comprised of a polyimide resin.

8. A semiconductor device according to claim 1, wherein each of the holes has an inner circumferential surface with a diameter which is narrow on the lead side and wide on a tape surface side away from the lead.

9. A semiconductor device according to claim 1, wherein the electrodes provided on the main surface of the semiconductor chip are arranged along a center of the main surface of the semiconductor chip.

10. A semiconductor device according to claim 1, wherein the electrodes provided on the main surface of the semiconductor chip are arranged along edges of the semiconductor chip.

11. A semiconductor device according to claim 1, wherein the bump electrodes are arranged in a plurality of columns.

12. A semiconductor device according to claim 1, wherein the bump electrodes are arranged in a plurality of columns and also in a staggered pattern.

13. A semiconductor device according to claim 1, wherein an insulating resin layer is provided which covers a back surface of the semiconductor chip opposite the main surface thereof.

14. A semiconductor device according to claim 1, wherein the electrodes provided on the main surface of the semiconductor chip are arranged along a center of the main surface of the semiconductor chip, the opening is an elongated hole correspondingly to the column of the electrodes.

15. A multi-tier type semiconductor device having a plurality of semiconductor devices of claim 1 stacked one upon the other, wherein the bump electrodes of the semiconductor device on an upper tier are electrically connected to the leads running through the holes in the semiconductor device on a lower tier.

16. A multi-tier type semiconductor device according to claim 15, wherein the semiconductor chips in all of the semiconductor devices have their electrodes arranged along a center of the main surface thereof.

17. A multi-tier type semiconductor device according to claim 15, wherein the semiconductor chips in all of the semiconductor devices have their electrodes arranged along edges of the main surface thereof.

18. A multi-tier type semiconductor device according to claim 15, wherein the semiconductor chips in some of the semiconductor devices have their electrodes arranged along a center of the main surface thereof and the semiconductor chips in the remaining semiconductor devices have their electrodes arranged along edges of the main surface thereof.

19. A semiconductor device comprising:

an insulating tape having a first surface, a second surface opposite the first surface, an opening penetrating the insulating tape, a plurality of holes, an elongated slit zone formed with a continuous slit or a plurality of serially arranged slits disposed between said opening and said plurality of holes, an inner area surrounded by said elongated slit zone, and an outer area separated from said inner area by said elongated slit zone, said opening being disposed at said inner area, said plurality of holes being disposed at said outer area along peripheries of the tape;

a plurality of first leads formed on one of the first and second surfaces of the tape so that each of said plurality of first leads includes a portion extending into the area of said opening and reaches into a corresponding one of said plurality of holes;

a plurality of second, dummy leads formed on said one of the first and second surfaces of the tape so that one ends of said dummy leads are spaced from said opening and the other ends of said dummy leads extend into the corresponding holes, respectively;

a semiconductor chip having a plurality of electrodes on a main surface thereof, the semiconductor chip being disposed within said inner area, the electrodes being connected with the corresponding portions of the first leads extending into the area of said opening;

an encapsulant formed of an insulating resin so as to cover the main surface of the semiconductor chip, the leads and a portion of the tape on said inner area and so as to fill said opening but to expose said slit zone and said plurality of holes;

bump electrodes provided on the leads extending out of the holes so that the semiconductor chip and the bump electrodes are disposed on the same surface side of the leads and so that tops of the bump electrodes project from the holes over the thickness of the semiconductor chip; and at least one layer of an insulating material formed on the outer area of the tape in a manner to expose the slit zone and the surfaces of said leads in said holes on which surfaces said bump electrodes are not formed.

20. A semiconductor device comprising:

an insulating base film having a first surface, a second surface opposite the first surface, an inner area, an outer area, an elongated slit zone formed with a continuous slit or a plurality of serially arranged slits so as to separate the inner area from the outer area by said slit zone, an elongated hole formed at said inner area, penetrating said insulating film to provide an open space, a plurality of circular holes formed at said outer area along peripheries of the base film;

a first group of conductive layers formed on one of the first and second surfaces of the rectangular-shaped insulating film so that each of said conductive layers includes a portion suspended in said open space of said elongated hole and extends to cross said slit zone to reach the corresponding circular hole;

a second group of conductive layers formed on said one of the first and second surfaces of the rectangular-shaped insulating film and being extended such that each conductive layer of the second group crosses said slit zone to reach a corresponding circular hole but is spaced away from said open space of said elongated hole;

a semiconductor chip having a first main surface and a second main surface opposite the first main surface and formed with a plurality of electrodes on the first main surface, the semiconductor chip being disposed within said inner area and with the plurality of electrodes facing said open space of said elongated hole, said plurality of electrodes being electrically connected with the portions of the corresponding conductive layers of said first group at the elongated hole;

an insulating encapsulation member formed so as to cover the first main surface of the semiconductor chip, portions of the conductive layers and of the film located at said inner area and to fill said elongated hole but to expose said slit zone and said outer area so that the peripheries of said encapsulation member are bordered by said slit zone; and bump electrodes provided on portions of the conductive layers located at said plurality of circular holes so that the semiconductor chip and the bump electrodes are disposed on a same surface side of the conductive layers and so that tops of the bump electrodes project from the holes over the second main surface of said semiconductor chip, respectively.

21. A semiconductor device comprising:

an insulating base film having a first surface, a second surface opposite the first surface, an elongated slit zone formed in a rectangular-shape with a continuous slit or a plurality of serially arranged slits, an elongated hole penetrating said insulating base film to provide an open space disposed within an area surrounded by said rectangular-shaped elongated slit zone, a plurality of circular holes formed along peripheries of the base film, wherein the slit or slits are formed along the bent corners of said rectangular-shaped elongated slit zone;

a first group of conductive layers formed on one of the first and second surfaces of the rectangular-shaped insulating film so that each of said conductive layers includes a portion suspended in said open space of said elongated hole and extends to cross said slit zone to reach the corresponding circular hole;

a second group of conductive layers formed on said one of the first and second surfaces of the rectangular-shaped insulating film and being extended such that each conductive layer of the second group crosses said slit zone to reach a corresponding circular hole but is spaced away from said open space of said elongated hole, respectively;

a semiconductor chip having a first main surface and a second main surface opposite the first main surface and formed with a plurality of electrodes on the first main surface, the semiconductor chip being disposed within the area surrounded by said elongated slit zone and with the plurality of electrodes facing said open space of said elongated hole, said plurality of electrodes being electrically connected with the portions of the corresponding conductive layers of said first group at the elongated hole; and bump electrodes provided on portions of the conductive layers located at said plurality of circular holes so that the semiconductor chip and the bump electrodes are disposed on a same surface side of the conductive layers and so that tops of the bump electrodes project from the holes over the second main surface of said semiconductor chip, respectively.

* * * * *